(12) United States Patent
Jerphagnon et al.

(10) Patent No.: US 10,816,430 B1
(45) Date of Patent: Oct. 27, 2020

(54) METHODS TO DETECT ANOMALIES AND TO MEASURE WATER USAGE IN PUMPING PLANTS USING ENERGY CONSUMPTION DATA

(71) Applicant: PowWow Energy, Inc., Sunnyvale, CA (US)

(72) Inventors: Olivier Jerphagnon, Redwood City, CA (US); Stanley Knutson, San Francisco, CA (US); Leneve Ong, Emeryville, CA (US)

(73) Assignee: PowWow Energy, Inc., Sunnyvale, CA (US)

( * ) Notice: Subject to any disclaimer, the term of this patent is extended or adjusted under 35 U.S.C. 154(b) by 183 days.

(21) Appl. No.: 15/860,873

(22) Filed: Jan. 3, 2018

Related U.S. Application Data

(63) Continuation of application No. 14/506,567, filed on Oct. 3, 2014, now Pat. No. 9,874,489.

(60) Provisional application No. 61/888,459, filed on Oct. 8, 2013.

(51) Int. Cl.
| | | |
|---|---|---|
| *G06F 11/30* | (2006.01) | |
| *G01M 3/00* | (2006.01) | |
| *G01R 21/00* | (2006.01) | |
| *A01G 25/16* | (2006.01) | |
| *G01M 3/04* | (2006.01) | |

(52) U.S. Cl.
CPC ............... *G01M 3/00* (2013.01); *A01G 25/16* (2013.01); *G01M 3/04* (2013.01); *G01R 21/00* (2013.01); *Y02D 10/34* (2018.01)

(58) Field of Classification Search
CPC ....................................................... G01M 3/00
See application file for complete search history.

(56) References Cited

U.S. PATENT DOCUMENTS

| | | | | |
|---|---|---|---|---|
| 9,874,489 | B1 * | 1/2018 | Jerphagnon | G01M 3/40 |
| 2012/0239211 | A1 * | 9/2012 | Walker | A01G 25/16 |
| | | | | 700/284 |
| 2013/0334880 | A1 * | 12/2013 | Jerphagnon | H02J 3/381 |
| | | | | 307/23 |

FOREIGN PATENT DOCUMENTS

EP          2562610          2/2013

OTHER PUBLICATIONS

The Enery Services Provider Interface (OpenESPI) website/screenshot, downloaded Oct. 14, 2014, 1 page.

* cited by examiner

*Primary Examiner* — Phuong Huynh
(74) *Attorney, Agent, or Firm* — Pillsbury Winthrop Shaw Pittman LLP

(57) ABSTRACT

Water leaks and other anomalies in irrigation systems may be detected by analysis of energy consumption data captured from a utility power meter, and particularly energy data from smart meters that service water pumps. Furthermore, water usage can be measured indirectly from the energy required to move it given an understanding of its operating condition that ties water flow and electrical power. Unlike existing solutions that use water meters or other sensors, embodiments of the present method described herein detect water leaks and other anomalies from the electrical load for the water pump(s) and track the operating condition of the pump.

12 Claims, 34 Drawing Sheets

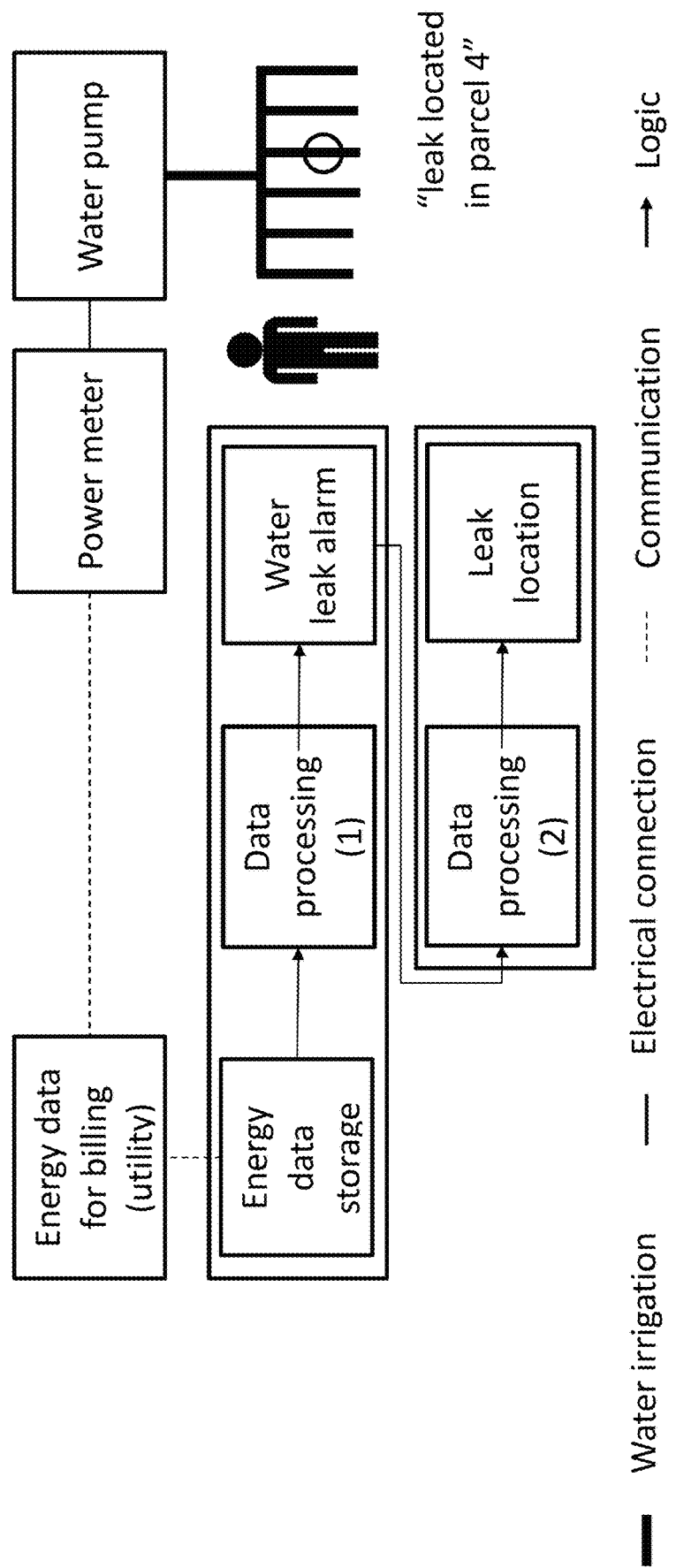
FIG. 7-A

FIG. 24

METHODS TO DETECT ANOMALIES AND TO MEASURE WATER USAGE IN PUMPING PLANTS USING ENERGY CONSUMPTION DATA

This application is a continuation of U.S. patent application Ser. No. 14/506,567, filed Oct. 3, 2014, which claims the benefit of U.S. Provisional Patent Application Ser. No. 61/888,459 filed Oct. 8, 2013 and is related to U.S. Utility patent application Ser. No. 14/506,484 filed Oct. 3, 2014, all of which are incorporated by reference herein.

FIELD OF THE INVENTION

The present invention relates generally to methods of detecting anomalies in pumping plants that irrigate farmed lands. Irrigation methods include surface irrigation techniques such as flood and furrow, and pressurized irrigation using a network of pipes such as sprinklers, center pivots, and drip nozzles.

BACKGROUND OF THE INVENTION

Pumps are a critical asset in agriculture. As water becomes scarcer due to climate change, farmers have to dig deeper to have access to ground-water and to compensate for lack of rain or State water through a network of canals. The depth of a well has increased from a few hundred feet to a few thousand feet. The cost per feet increases as well as traditional well drilling techniques are not sufficient. Oil and gas drilling techniques are now being used to go down to the appropriate depth. As a result, water pumping is becoming very energy intense. The deeper the water is, the more energy it takes to bring it up and to irrigate fields. In 2014, California spent an additional $454 in energy to extract ground water to compensate for the drought.

The pumping plant can be damaged by natural wear-and-tear of the propeller, a falling water table, an electrical failure, a malfunction in the filter that removes sand or other debris, and any external that changes the pressure of the overall pumping plant. In the case of pressurized irrigation systems, leaks will change the pressure and the normal operating condition of the pump. Leaks can be caused by a worker, an animal or a machine. Leaks can also be caused by wear and tear. Leaks are very labor intensive to locate (ranchers have to walk every other row in a large field). They usually go undetected until there is physical damage to a crop or to property, or when an increase in utility bills is observed by the farmer, which may be months after the leak started.

Water pumps are used to distribute the water throughout an irrigation system. Anomalous behaviors makes it more difficult to automate the irrigation system by a control system; it also makes the performance of the water pumps less predictable and prevents the effective use of energy management systems. Otherwise energy management systems could be: (1) used to leverage flexibility in the pumps that can be sold to a utility market; or (2) integrated with energy storage systems to use a renewable energy source onsite rather than conventional sources from the grid. See, for example, European patent application publication number EP20120181445 "Methods and apparatus for controlling irrigation systems", and U.S. patent application Ser. No. 13/844,605 "Digital electrical routing control system for use with electrical storage systems and conventional and alternative energy sources."

Currently, anomalies are detected by performing a pump efficiency test that measure the water flow, the internal pressure of the pump, and the power drawn by the pump. This defines the operating condition of a pump that can only be of certain values for each type of pump. Pump manufacturers provide pump curves that describe how the pump operates in water flow gallons-per-minute and pressure in feet-of-head for various sizes of pipes. It also provide the overall pump efficiency in percentage and the power drawn in horse-power. Pump tests are labor intensive and are recommended every few years to maintain the pump and reduce the load on power utility grids.

Leaks are a particularly of interest because they waste both water and energy. For water systems beyond the utility company's water meter, such as in farming operations, leaks have been typically identified by the appearance of wet areas on the property, more vigorous vegetation, or by seeing significantly larger utility bills weeks after the leak first begins.

Water is becoming more valuable as it becomes scarcer. Therefore, more farmers are now measuring how much water they consume. They can also optimize crop yield by controlling the amount of water applied to the field at particular time of the year. Current methods of measuring water usage include welding a flow meter into a piping system and taking regular manual readings, or by estimating it from the number of hours the pump was on. Both methods are imprecise and are labor intensive. For instance the operating condition of the pump may change over time, or the flow meter that was installed is not properly installed. Farmers are not always inclined to find a remedy to have more precise measurements, or maintain water records at all as they might be under the scrutiny of regulating bodies to use too much water. More than seventy percent of the world's fresh water supply is used for agriculture.

There is a need for improved methods of detecting anomalies in pumping plants and measure water usage for irrigation.

SUMMARY OF THE INVENTION

Water leaks and other anomalies in irrigation systems may be detected by analysis of energy consumption data captured from a utility power meter, and particularly energy data from smart meters that service water pumps. Furthermore, water usage can be measured indirectly from the energy required to move it given an understanding of its operating condition that ties water flow and electrical power. Unlike existing solutions that use water meters or other sensors, embodiments of the present method described herein detect water leaks and other anomalies from the electrical load for the water pump(s) and track the operating condition of the pump. These methods have the advantage of not requiring any extra hardware at the site of the irrigation system. In embodiments, methods of the present invention are very scalable due to the energy usage data captured from smart meters at the site of the irrigation system and made available through interfaces such as the Energy Service Provider Interface (ESPI) from Green Button that makes energy data available to millions of users and third party applications. See Energy Service Provider Interface at http://openespi.org/. Analysis of the energy data is done using an algorithm based on statistical analysis. Furthermore, machine learning programs can further identify the type of anomaly by recognition of electrical signatures of a water pump.

Further embodiments of the present invention include systems for the implementation of anomaly and/or leak detection and notification methods according to the aforementioned processes.

Further embodiments of the present invention include methods to maintain automated water records at the site of the pump.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 7A-E shows a schematic of a system and method of electrical signature collection to allow for identification of leaks in different parcels of an irrigated property, according to some embodiments of the present invention and energy signatures associated therewith;

FIG. 24 shows an implementation of the anomaly detection, the leak identification, and the water calculation part of a web application called Pump Monitor.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Furthermore, the present invention encompasses present and future known equivalents to the known components referred to herein by way of illustration.

Figure 1:
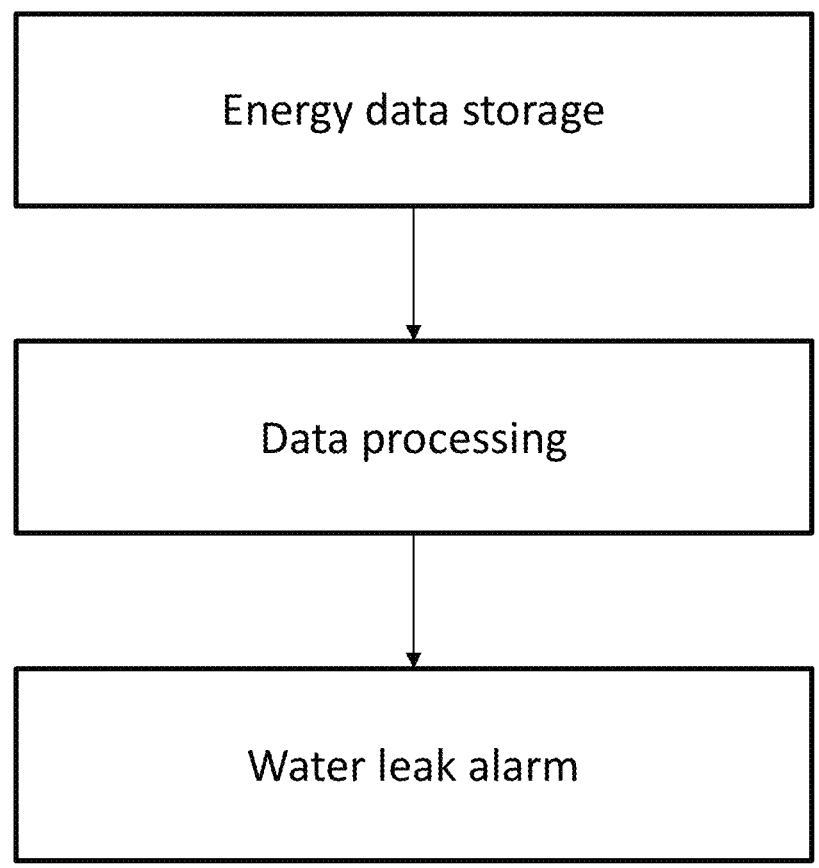
FIG. 1 shows a flow chart of a leak detection and notification method, according to some embodiments of the present invention.

The general method to detect and notify a water leak is described in the flow diagram of FIG. 1. It consists of an energy data capturing step ("energy data storage"), a data processing step ("data processing"), and an alarm signal step where the alarm signal is triggered by a threshold ("water leak alarm").

Figure 2:
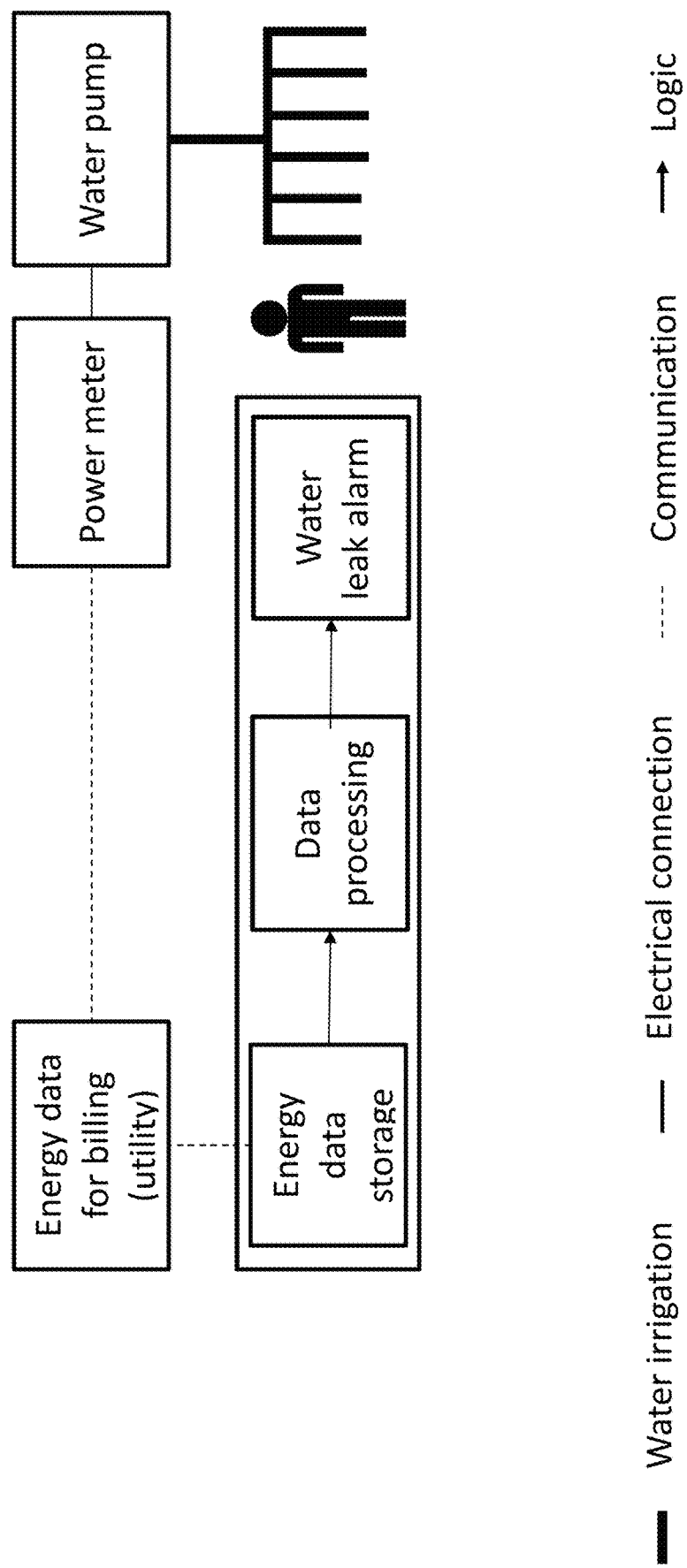
FIG. 2 shows a schematic of a system and method of leak detection and notification according to a first embodiment of the present invention.

In a first embodiment (FIG. 2), the energy data is captured from a smart meter operated by a utility (e.g., PG&E). Utilities use advanced metering infrastructure to automatically collect energy data for billing purposes. The data can be made available to third parties thanks to the Green Button interface. The energy data captured at regular intervals (e.g., 15 minutes) are made available typically once a day. A server can collect the data using a communication network such as the Internet. The energy data is stored in a secure database. In one embodiment, the database is secure to protect the privacy of the user. For example, the user can be a rancher such as a horse breeder or a farmer such as a vine-grower.

Figure 3:
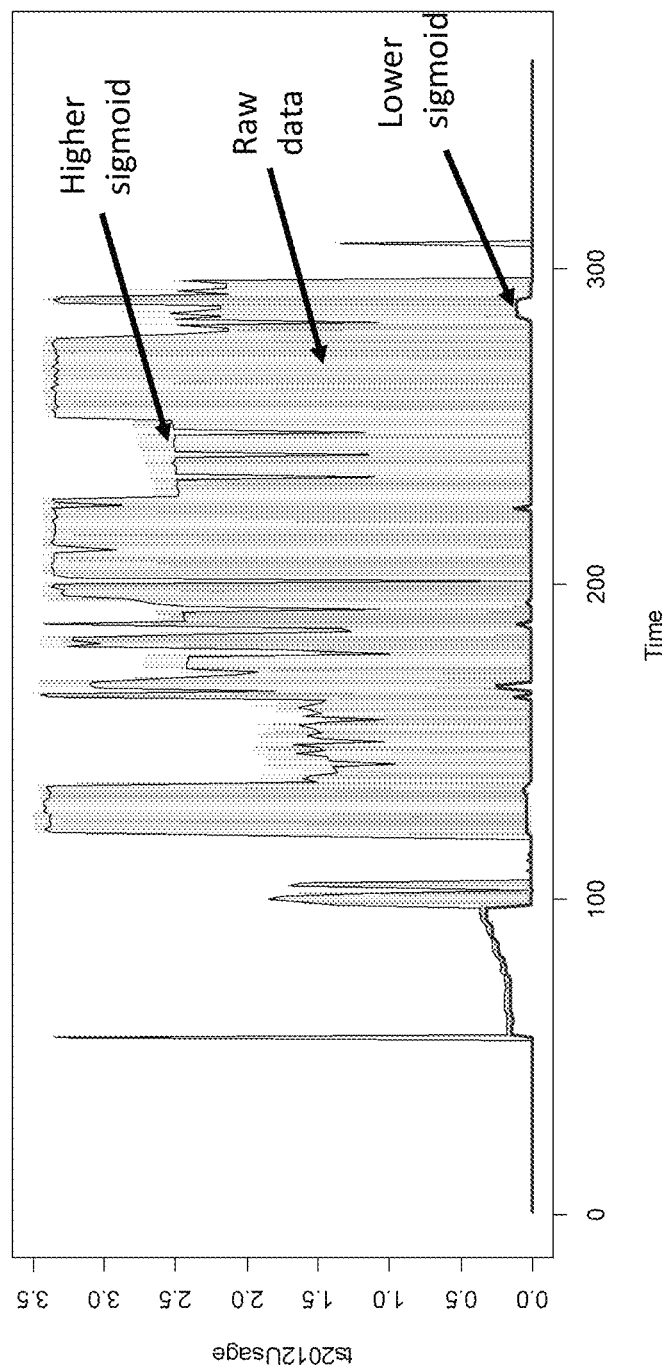
FIG. 3 shows an example of energy data collected for an irrigation pump (energy in kWh as a function of time in days), along with an error signal generated by a PAM algorithm, according to some embodiments of the present invention.

The data is processed using an algorithm. In one implementation, the algorithm is based on statistical data analysis. For the purpose of testing, a Partitioning Around Medoids (PAM) of class 3 algorithm was used. FIG. 3 shows an error signal (lower sigmoid) generated by PAM classification with 3 medoids; the raw energy data is in 15 minute increments over 13 months, with the error signal (lower sigmoid) showing that signature for a leak is to not go back to zero energy consumption when the irrigation cycle is off.

Historical data (e.g., 13 months) can be used to generate one or more thresholds. In one embodiment, only one threshold is used to send an alarm signal to the user. In another embodiment a second lower threshold is used to send a warning message. For the purpose of testing, an emergency alarm is sent via a text message to reach the user on his or her portable phone. In another embodiment, a warning message is sent by email.

Figure 4:
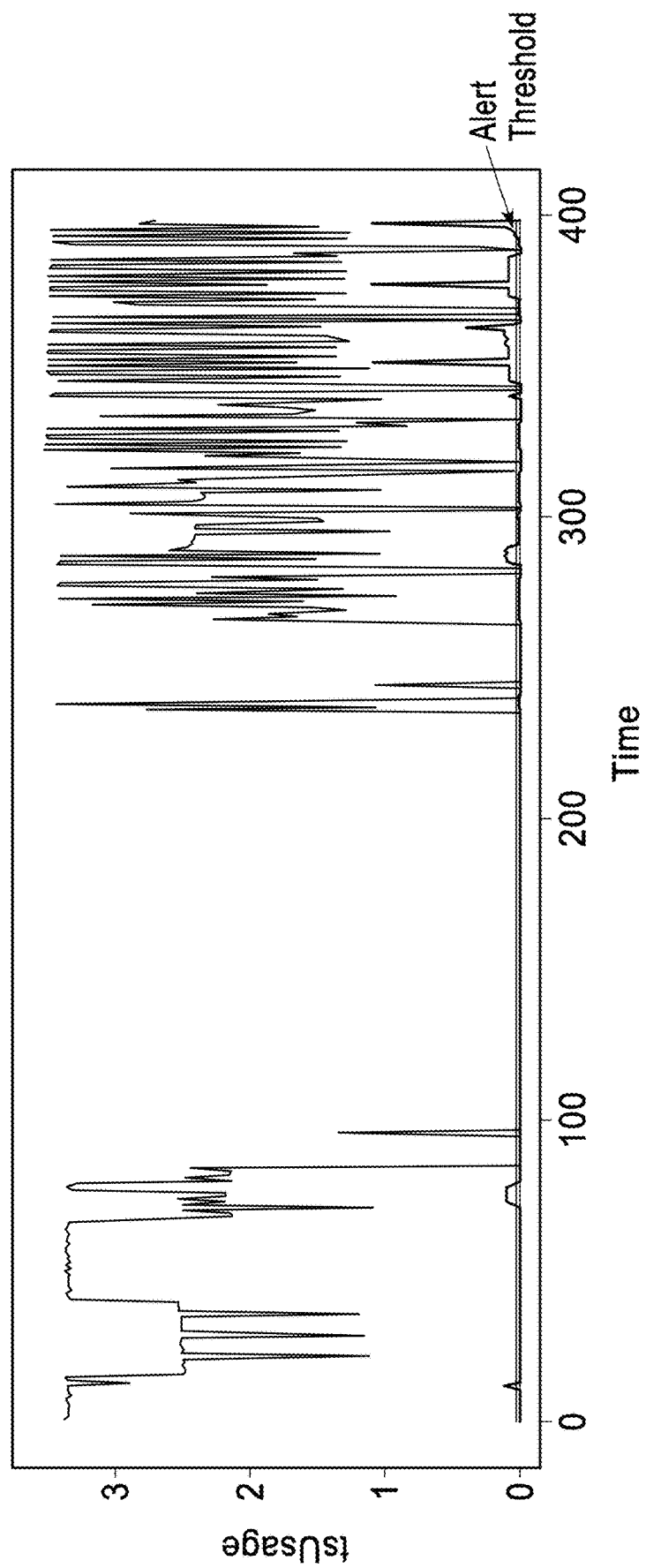
FIG. 4 shows a further example of energy data collected for the irrigation pump of FIG. 3, where the calculated error signal exceeds an alarm threshold generating an alarm, according to some embodiments of the present invention.

The method described above was tested in summer 2013 at a ranch in California. An apparatus was built as described above. A leak was reported in September (FIG. 4)—the error signal went over the alert threshold indicating a leak. The customer validated that the method detected a leak the user did not know about. The user was able to fix the leak, which resulted in thousands of gallons saved and hundreds of kilowatt-hours saved. More importantly, detection of the leak prevented physical damage to the property. A previous leak had flooded a field over time and ruined the property landscape. In some situations a leak can cause damage to crops such as, but not limited to, vines, orchards, and lettuce.

Figure 5:
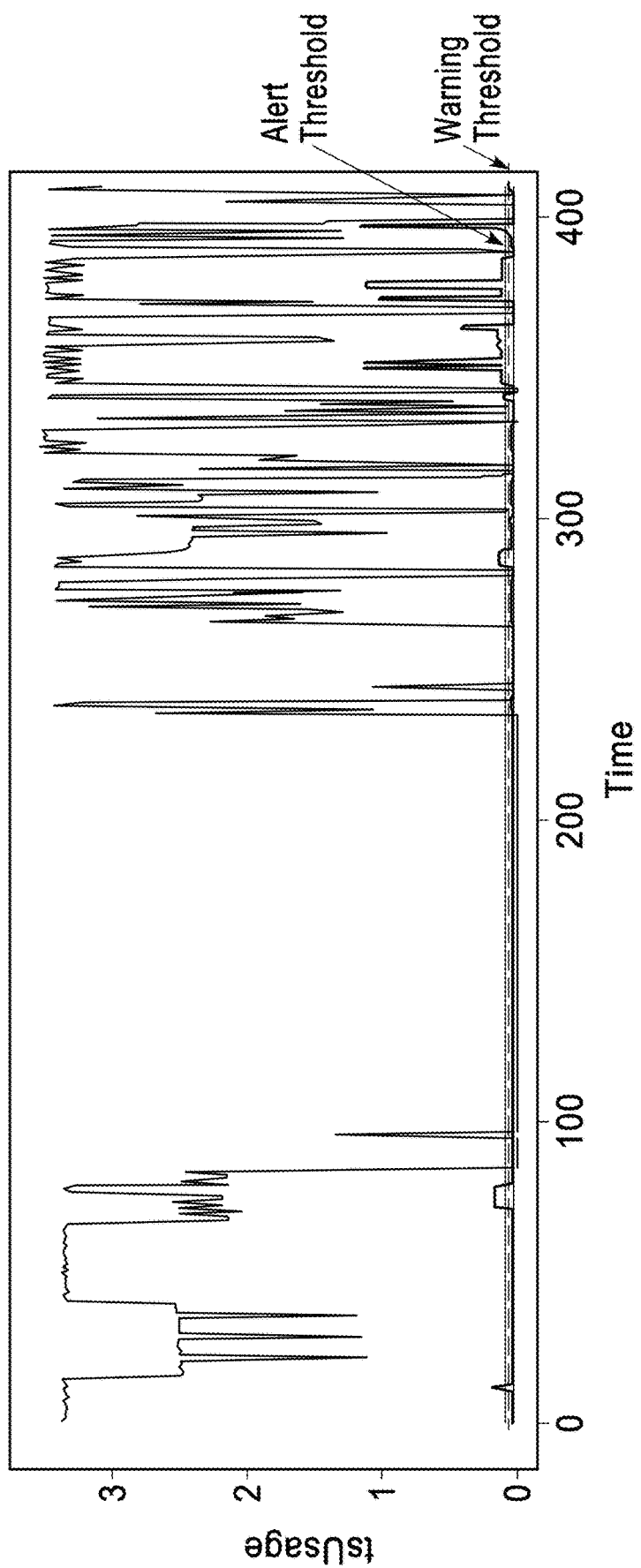
FIG. 5 shows an extension of the energy data of FIG. 4 by a few days, where the calculated error signal exceeds a warning threshold generating a warning, according to some embodiments of the present invention.

It has been found that the error signal tends to creep up (slowly increase) before a significant leak occurs. A warning threshold can be set at a fraction (a third, or other fraction, for example) of the alert threshold to bring attention to a developing leak. In one instance, a leak was predicted three days before it actually happened using this technique. For example, later in September, the statistical indicator (lower sigmoid) increased again and reached the warning threshold (FIG. 5). A warning email was sent predicting a leak. A few days later, the statistical indicator reached the alert threshold (FIG. 5) indicating a leak. An alarm text message was sent to the user of the irrigation system.

Figure 6:
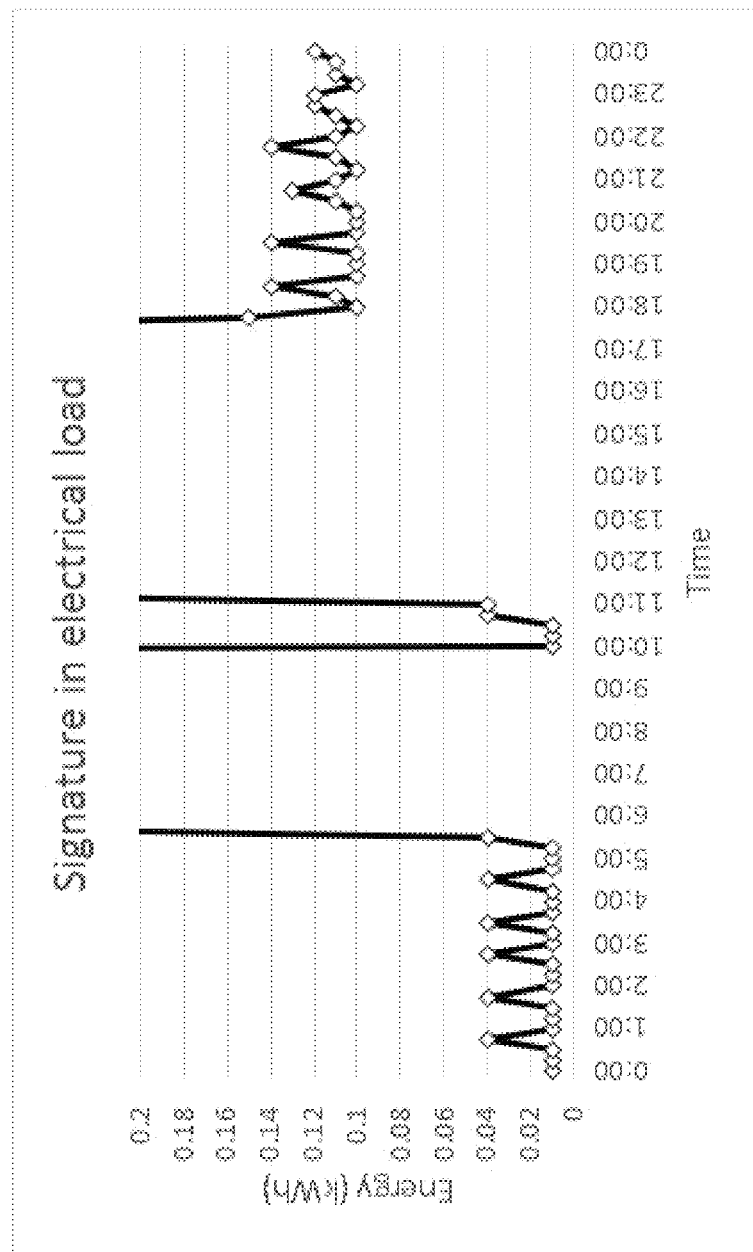
FIG. 6 shows an example of a unique electrical signature associated with a leak in a particular part of the irrigation system, according to some embodiments of the present invention.
Figure 7B:
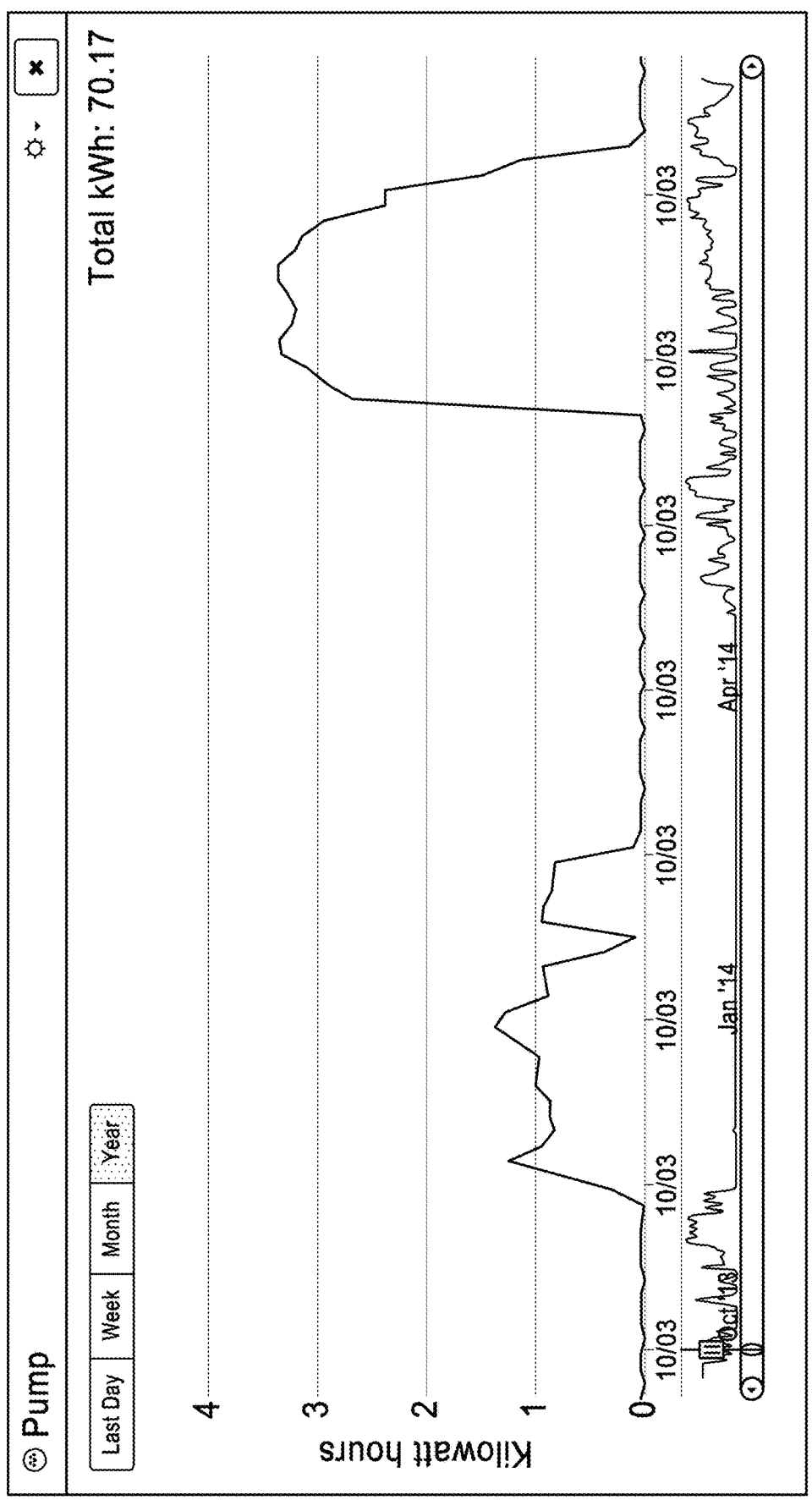
Figure 7C:
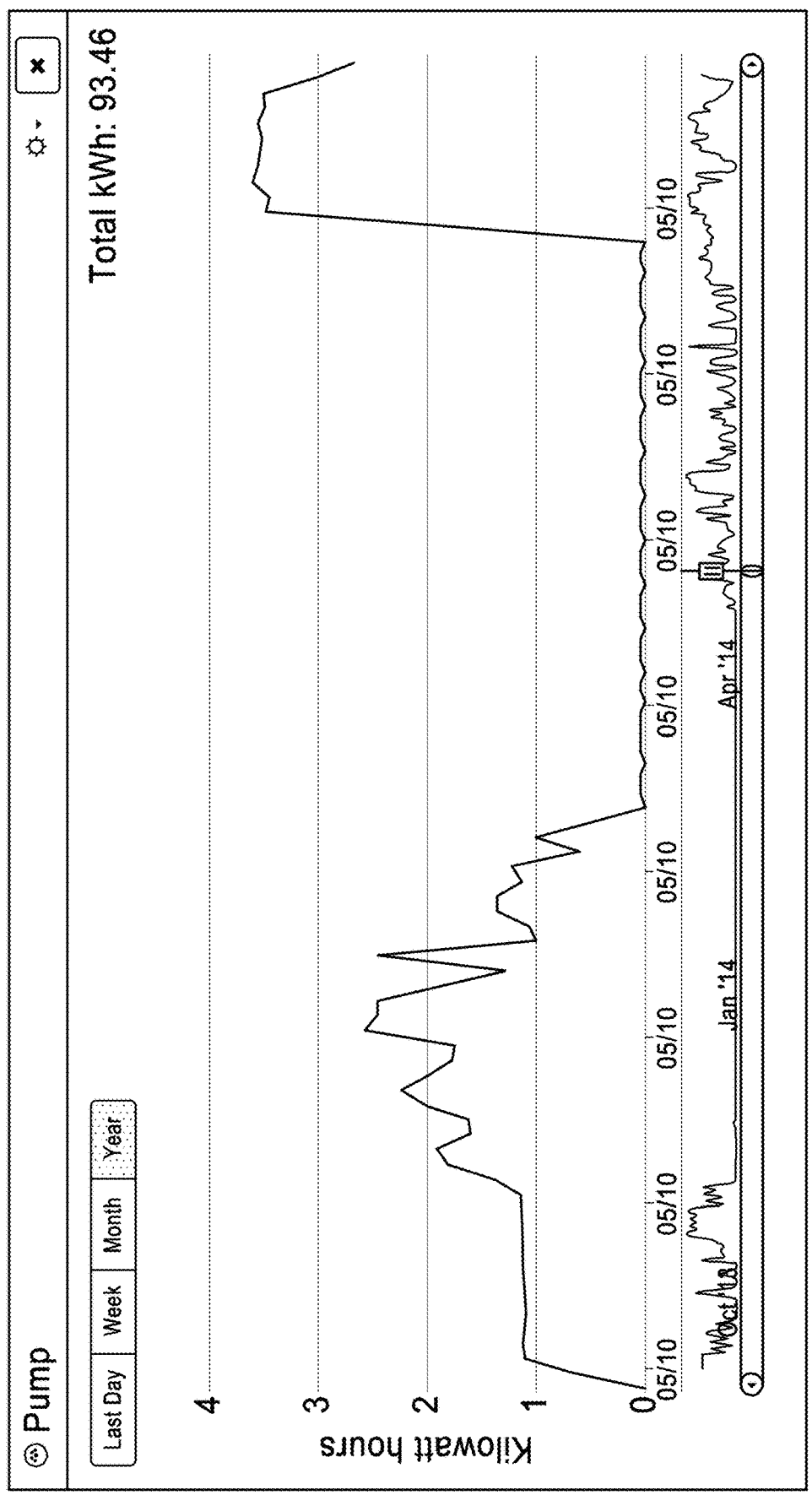
Figure 7D:
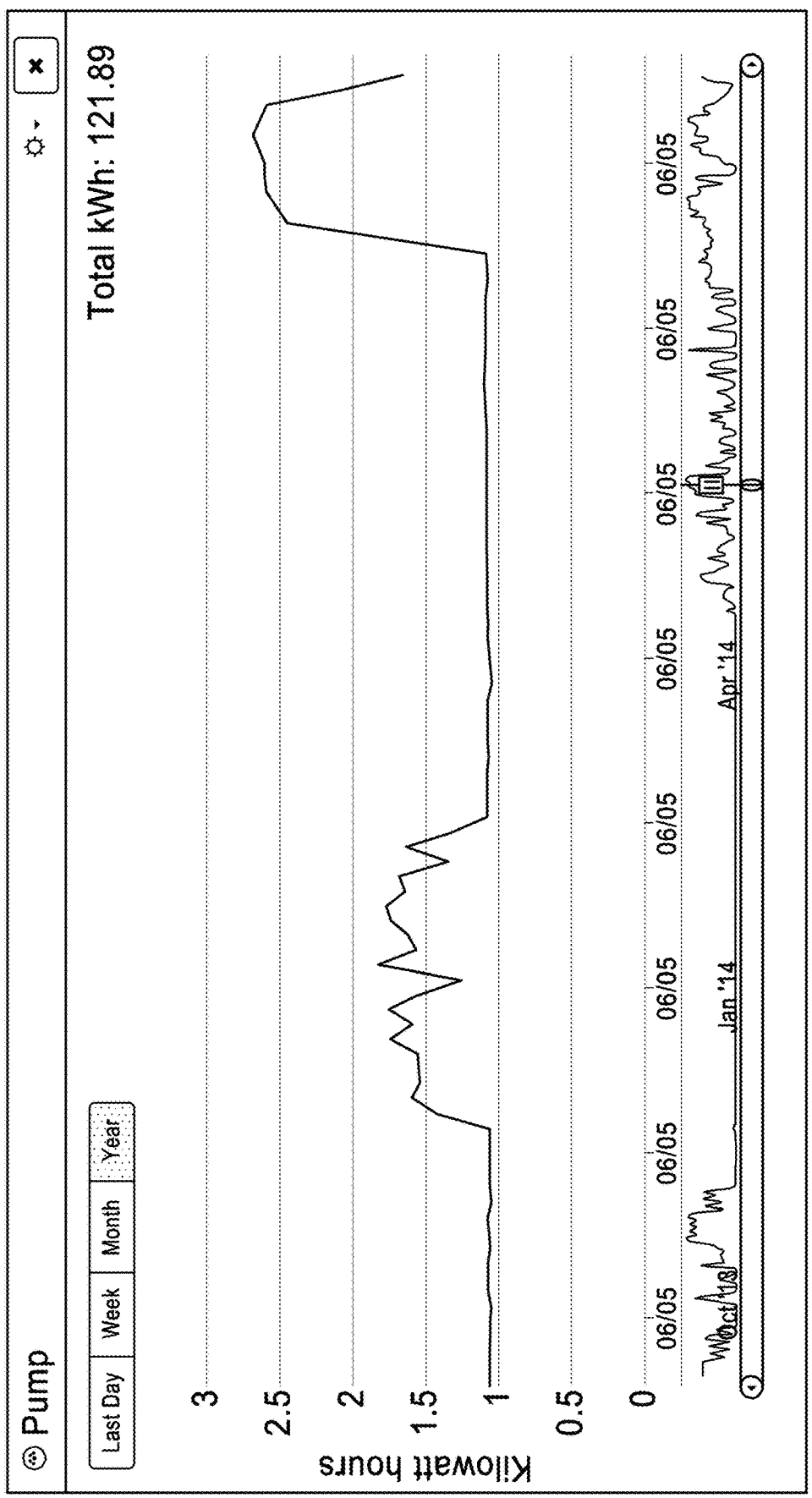
Figure 7E:
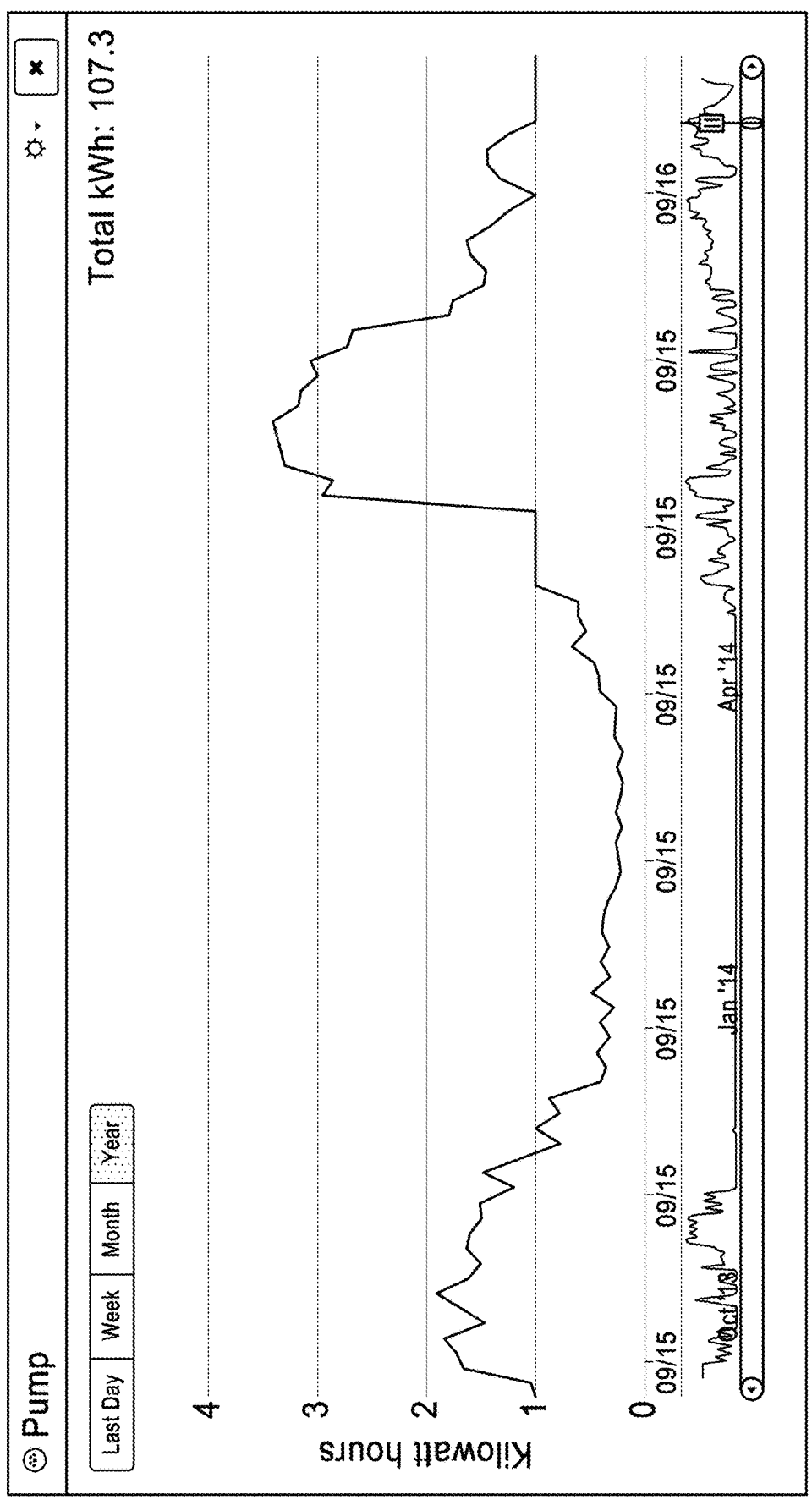

The method described above can be enhanced to not only detect when a leak occurs but also where it is located. This can save many man-hours looking for the leak on a large field. Various leaks create different signatures in the electrical load (FIG. 6 shows electrical signatures before a catastrophic leak). The signatures can be recognized by machine learning algorithms provided with data sets that assign signatures to various parcels on the property. The assignment of signatures to different parcels on a property can be done in a training process such as shown in FIG. 7A-7E, with FIG. 7B-7E illustrating how the different signatures, as described above, are used to determine location. FIG. 7A shows the overview of the system. FIG. 7B illustrates the energy load profile for a pump connected to two parcels: one parcel is irrigated in the morning, one in the evening. In the load profile shown in FIG. 7C, there is a leak on the first parcel. In the load profile shown in FIG. 7D, there is a leak on the second parcel. In the load profile shown in FIG. 7E, a leak on the second parcel was fixed but there is still one on the first parcel.

Figure 8:
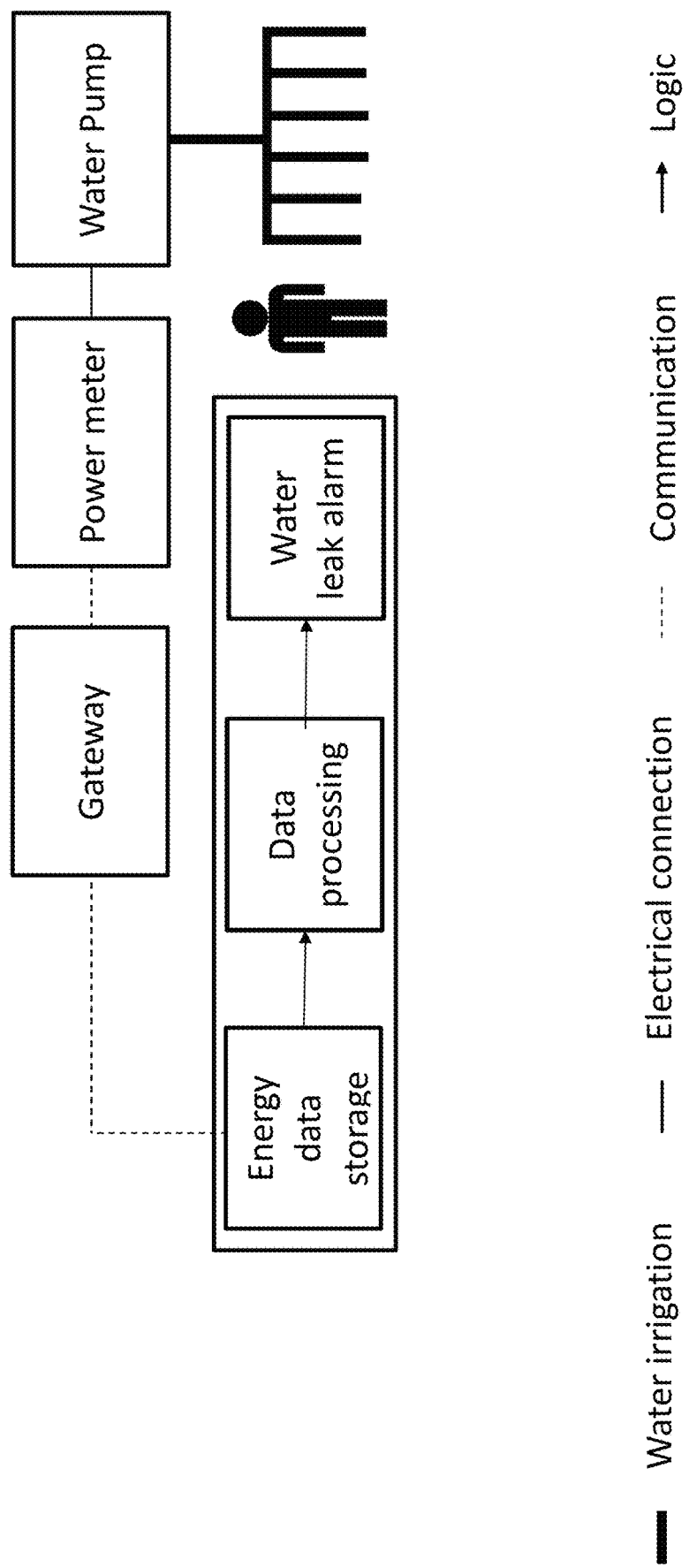
FIG. 8 shows a schematic of a system and method of leak detection and notification with multiple electrical devices attached to the power meter, according to some embodiments of the present invention.

In another embodiment, a gateway is collocated with the meter, as shown in FIG. 8, to capture finer-grained data at shorter intervals (e.g., 1 minute). The Device 2, Device n, etc. in FIG. 8 are other electrical devices such as another water pump, an HVAC system, a refrigerator, a lighting system, or any other appliance, which complicate the energy data collected, such that filtering is required. The data is captured by a server using a communication network. The finer-grained data can be used to detect the leak in a real-time rather than within a 24-hour period. The finer-grained data provides more detailed electrical signatures that can be used to identify the location of the leak more accurately.

Figure 9:
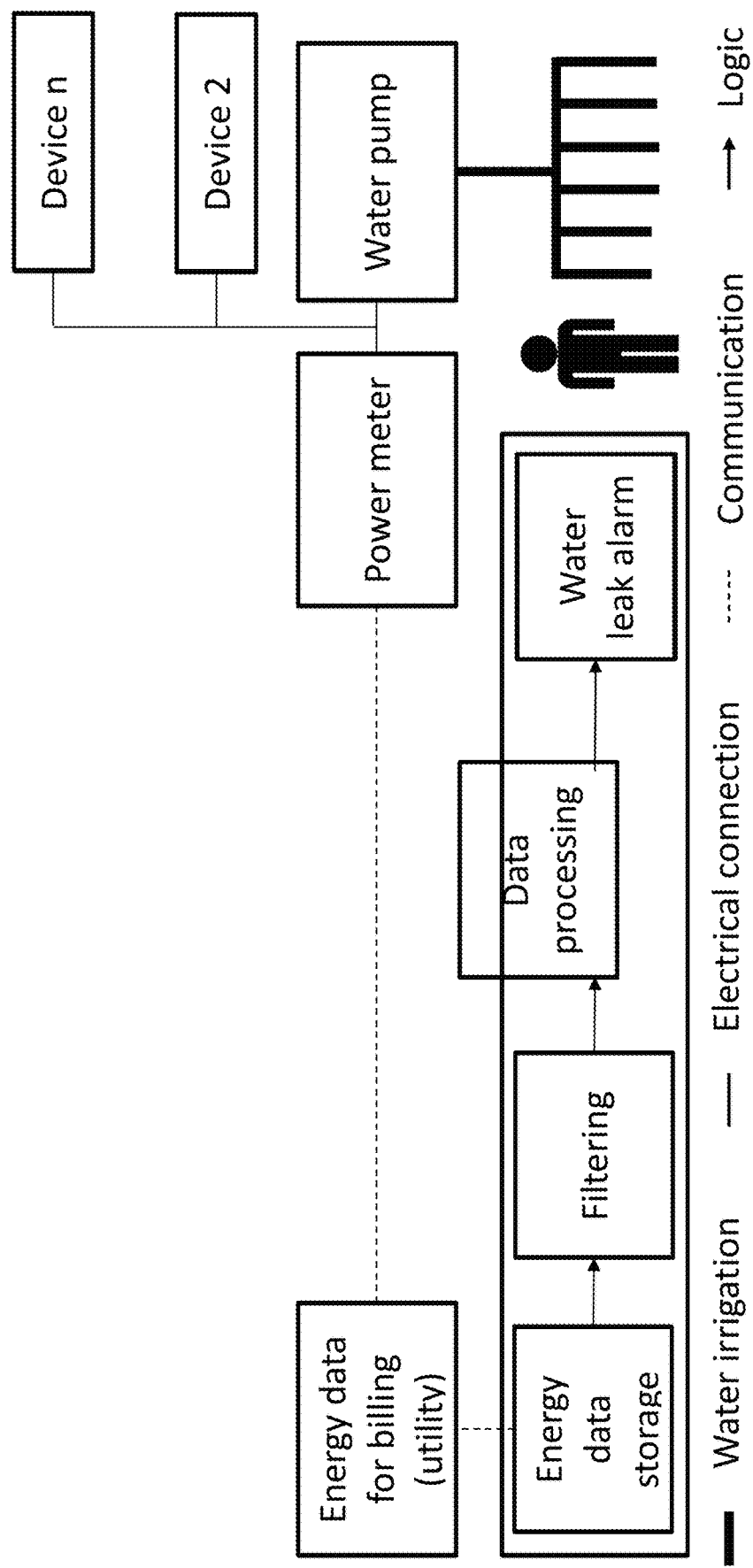
FIG. 9 shows a schematic of a system and method of leak detection and notification with a finer-grained data collection capability and filtering, according to some embodiments of the present invention.

In yet another embodiment, more than one electrical device is attached to the meter (FIG. 9). The energy data related to the water pump is extracted using a filter. The method described above is used to process the extracted data and to generate an alarm when a leak is detected (FIG. 9).

Figure 10:
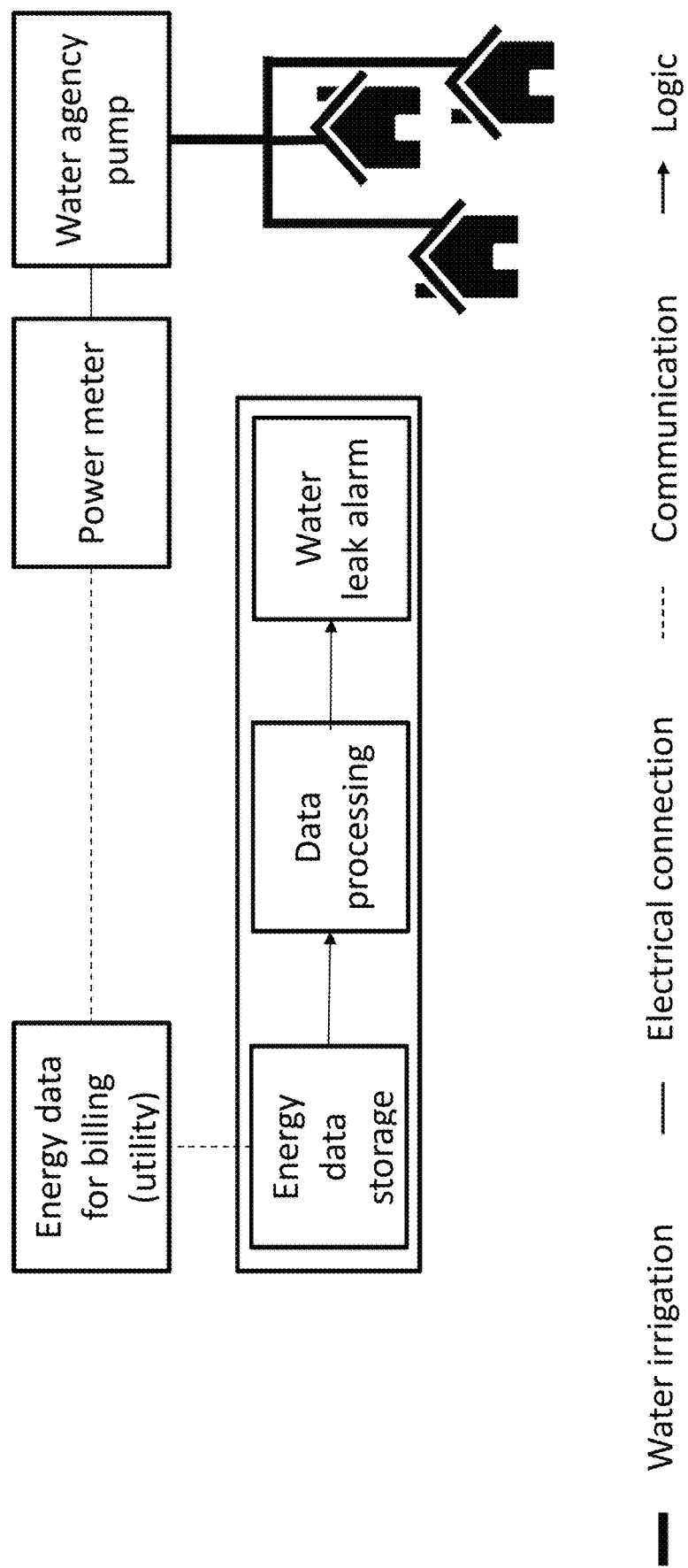
FIG. 10 shows a schematic of a system and method of leak detection and notification for a water distribution system for homes, according to some embodiments of the present invention.

The method herein can be generalized to a water distribution system where a large pump distributes water to various homes, as shown in FIG. 10. It has not been demonstrated, but a leak at a home will generate changes in the pumping system. However, it remains to be tested that the response in electrical load is large enough to be detected reliably by a data mining algorithm.

Figure 11:
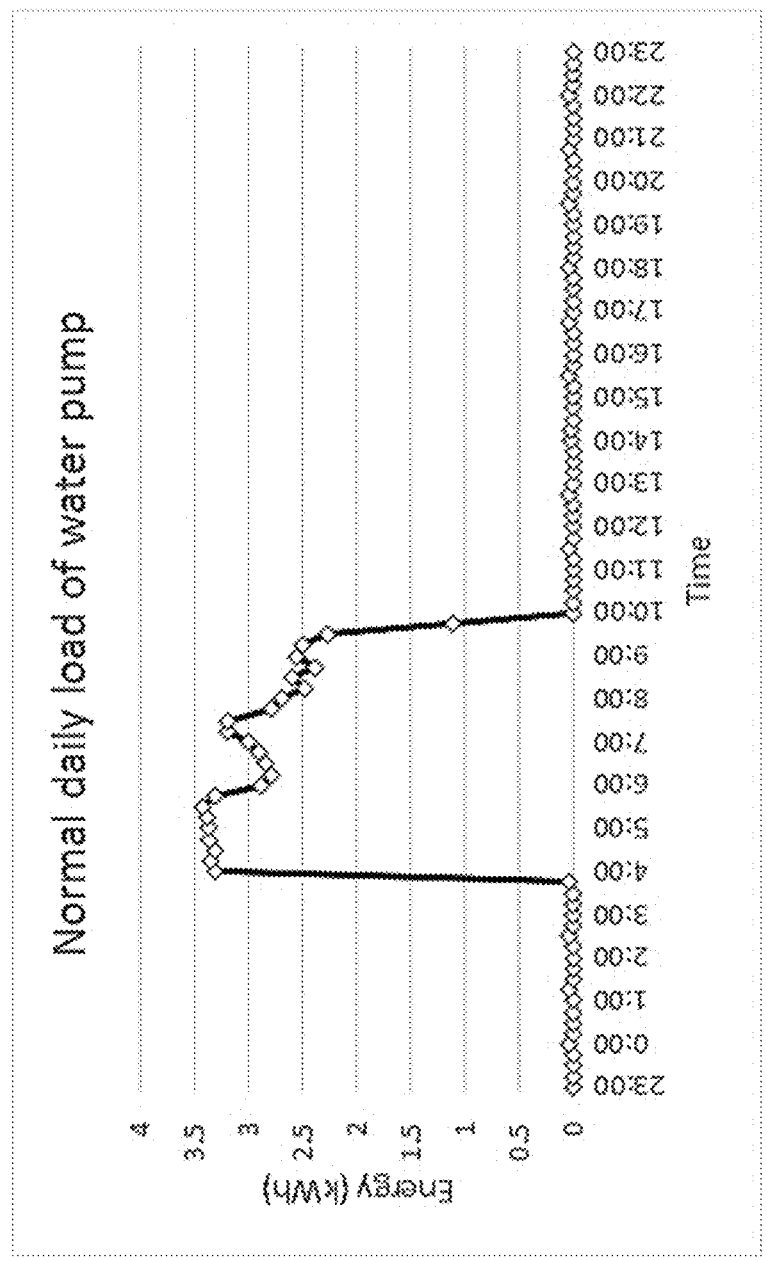
FIG. 11 shows an example of a normal daily electrical load for a water pump, the data being collected according to some embodiments of the present invention.
Figure 12:
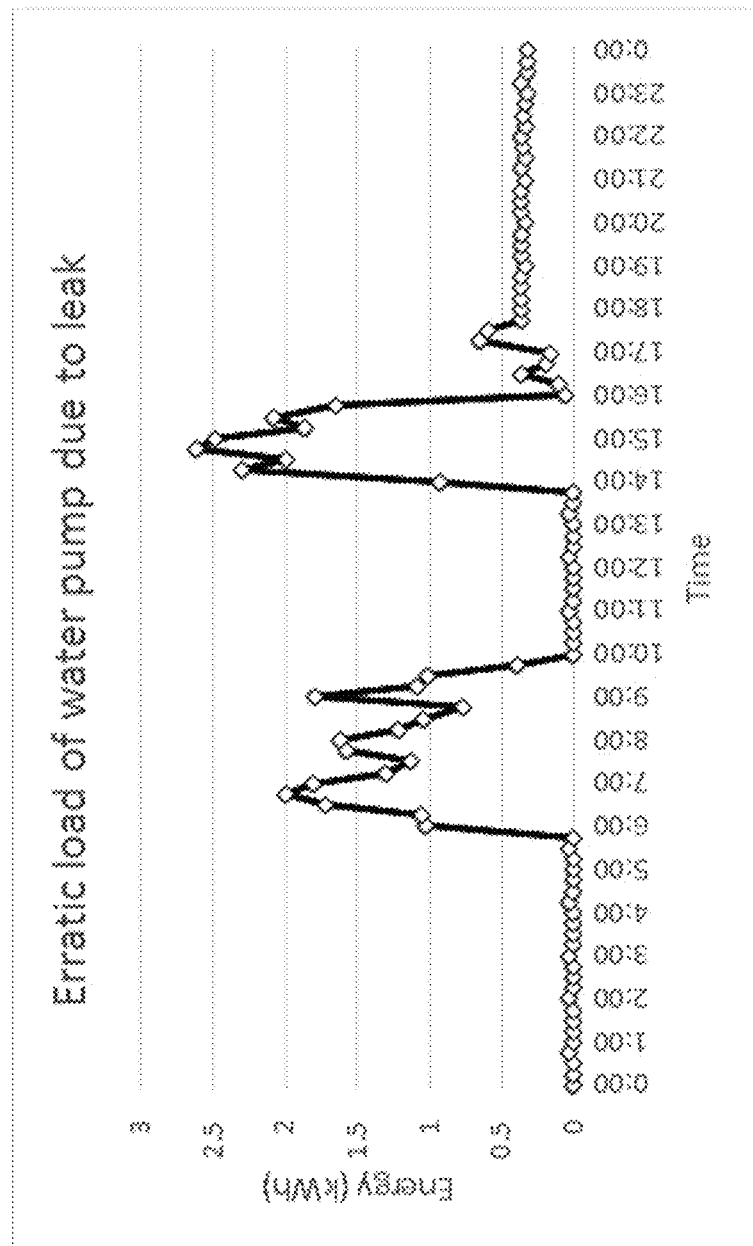
FIG. 12 shows an example of an erratic electrical load for a water pump due to an irrigation leak, the data being collected according to some embodiments of the present invention.

Finally, the method described herein can be used to remove anomalies in the way water pumps are run. This is particularly useful to automate irrigation from historical patterns. If not caught early using the method described above, leaks can create significant changes in the electrical load over time, which prevents predictable and repeatable automation. A normal load was captured for one test site (FIG. 11). An abnormal load was captured during a long-term leak (FIG. 12).

Figure 13:
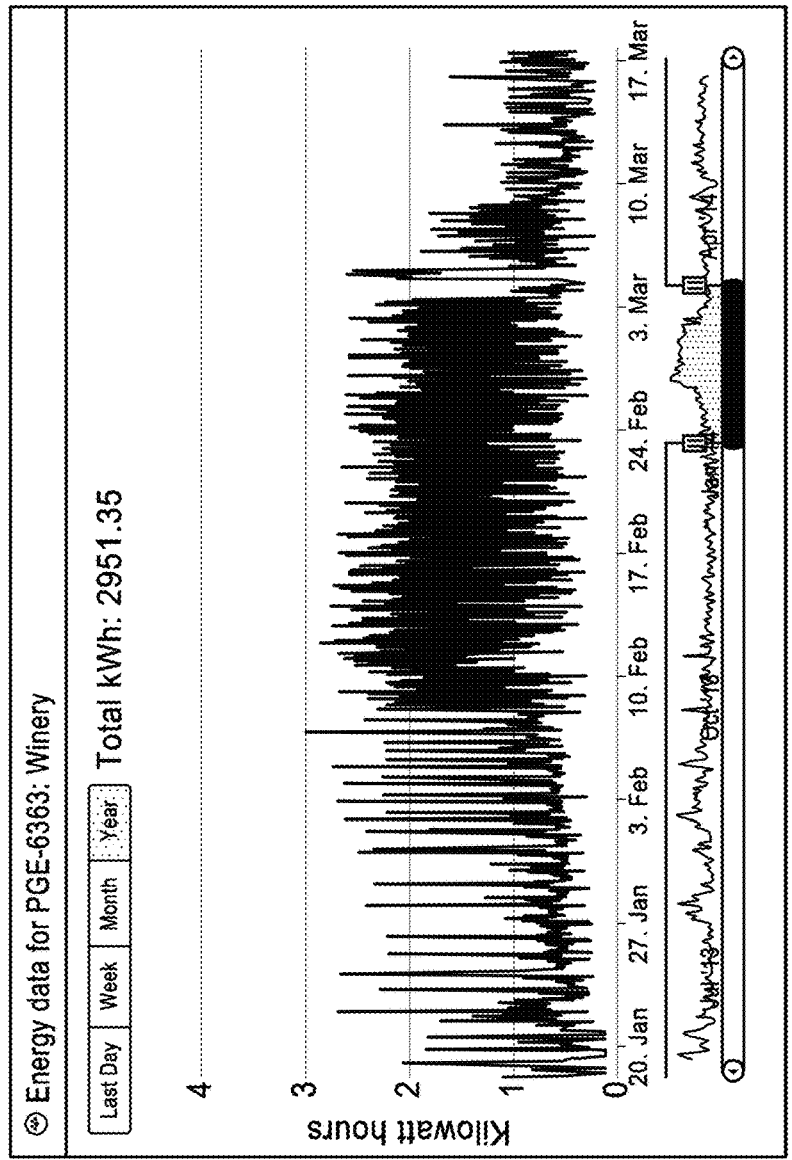
FIG. 13 illustrates an electrical load of a winery with a pump and other appliances including an HVAC (a). One leak occurred in February 2014 and the winemaker at the site of the leak (b) uses now our alert solution to avoid future leaks.
Figure 14:
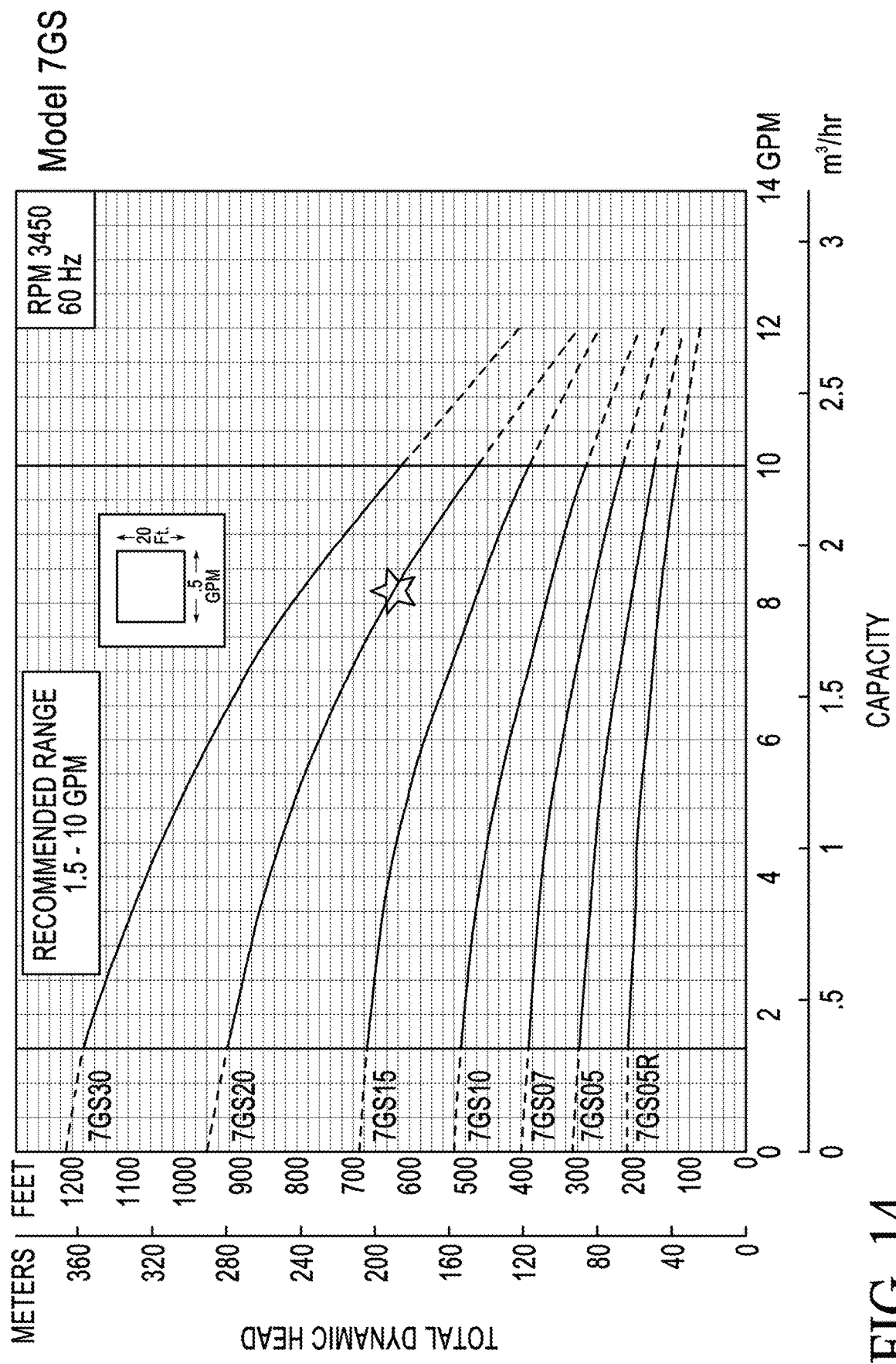
FIG. 14 illustrates a curve describing the operation conditions of a pump model (e.g., 7GS20) with a capacity, Q. in m3 per hour and a Total Dynamic Head (TDH) in feet.

As described above, one aspect of the invention is the detection of a water leak in a system at a winery where several appliances including the pump are connected to the meter, and energy data can be used to estimate the amount of water leaked. One year of energy load was captured including the period when the leak occurred in February (FIG. 13-a). The winemaker stands next to the leak (FIG. 13-b). The pump operating at the winery has one speed that corresponds to the normal operating condition on the pump curve for that particular pump model and for the size of the pipe connected to the pump (FIG. 14).

Figure 15:
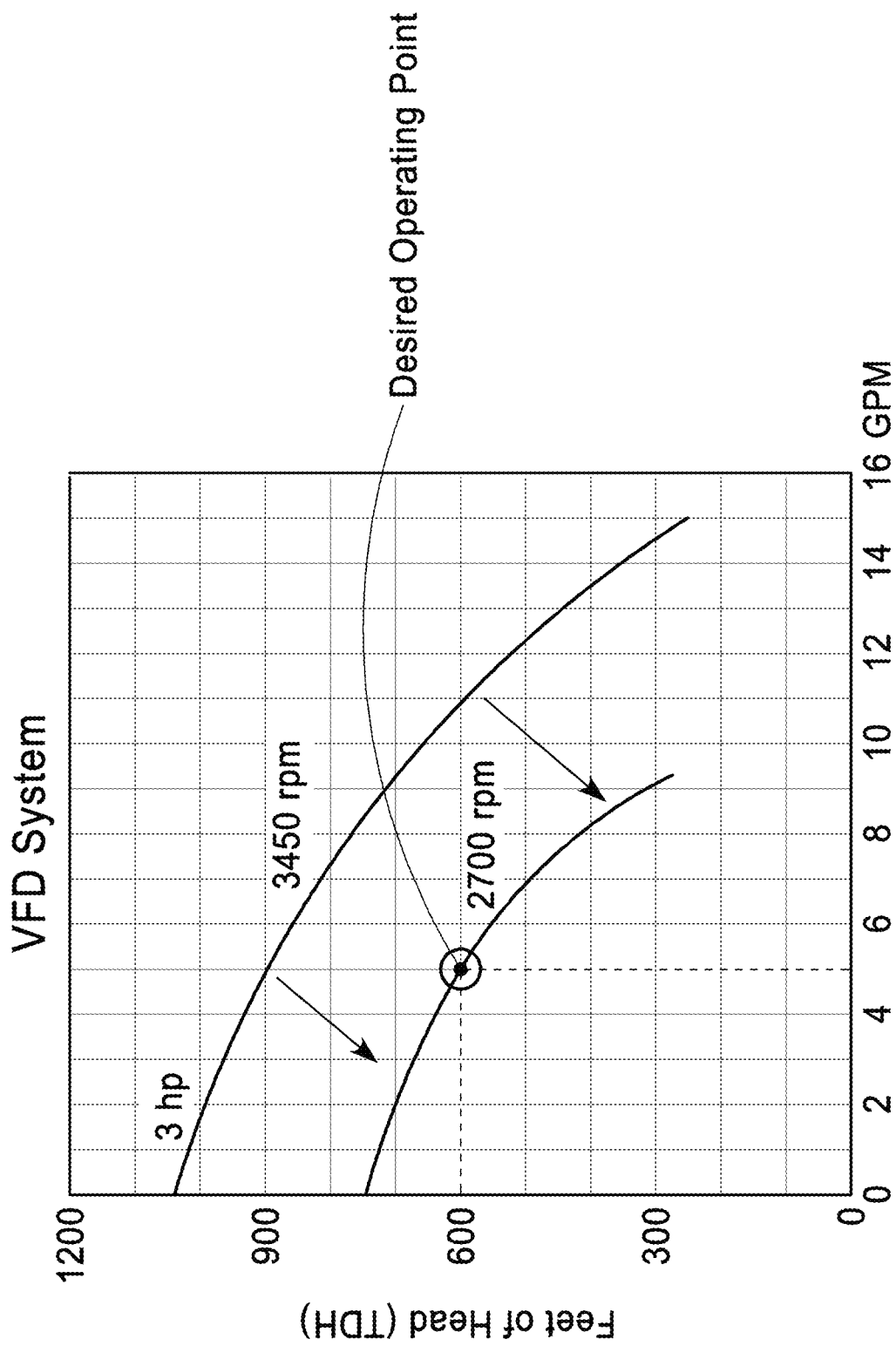
FIG. 15 shows an example of distinguishing between multiple operating conditions.

Further, specific embodiments described herein recognize that one can distinguish the case of traditional one-speed pumps (with one operating condition) and more recent variable-speed pumps (with multiple operating conditions) that are driven by a Variable Frequency Drive (VFD) control system. An example is given in FIG. 15.

Figure 16:
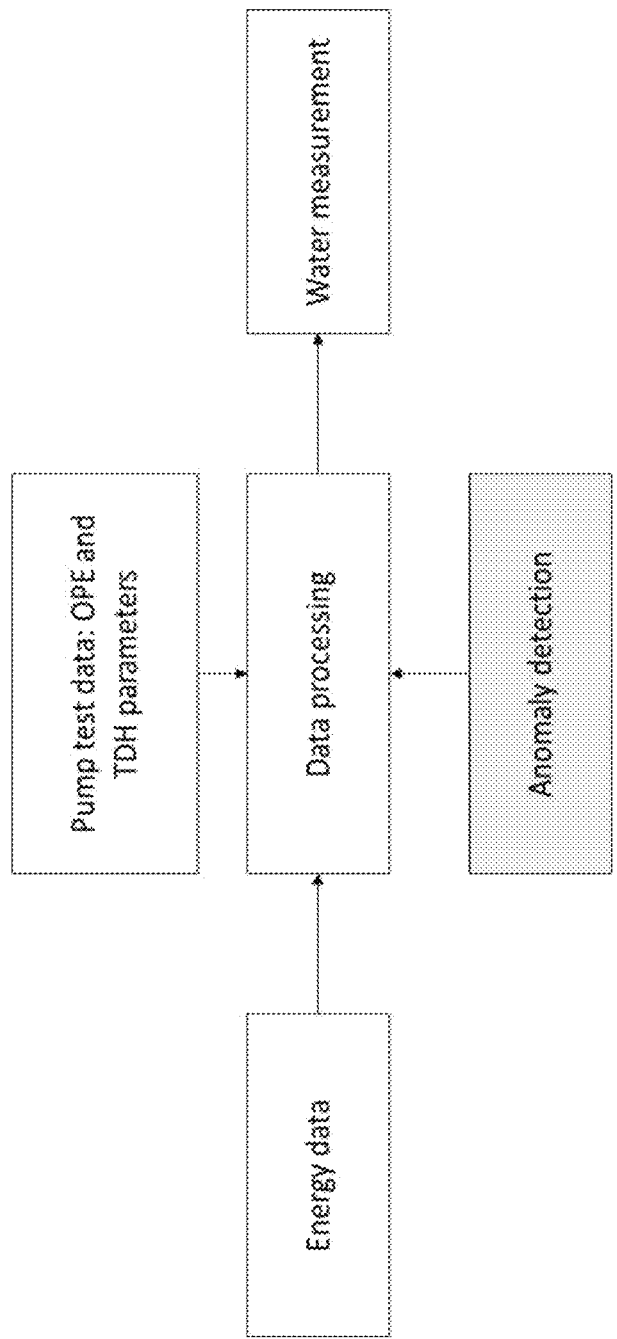
FIG. 16 shows a method to measure water usage in a pumping plant from energy data. It leverages anomaly detection to track the accuracy of the measurement and alert the farm in case it needs to be repaired or tested for efficiency.
Figure 17:
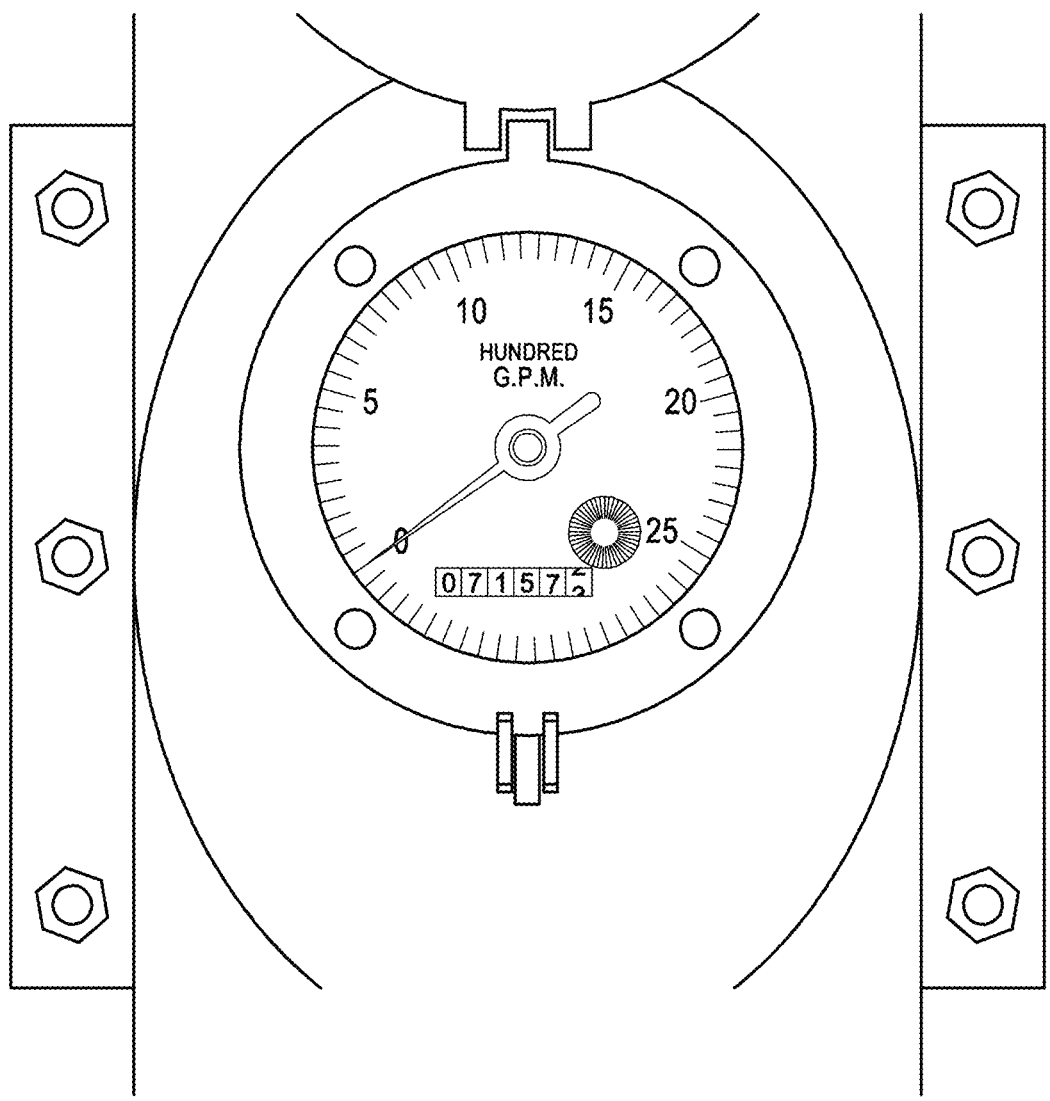
FIG. 17 is a picture of flow meter with both gallon-per-minute reading and cumulative acre-feet measurements. Grower does not keep water records from the flow meter as they use know-how developed over a long period of time to decide how long to run the pump for across the season. Water application late can be used to control the time of harvest for instance.
Figure 18:
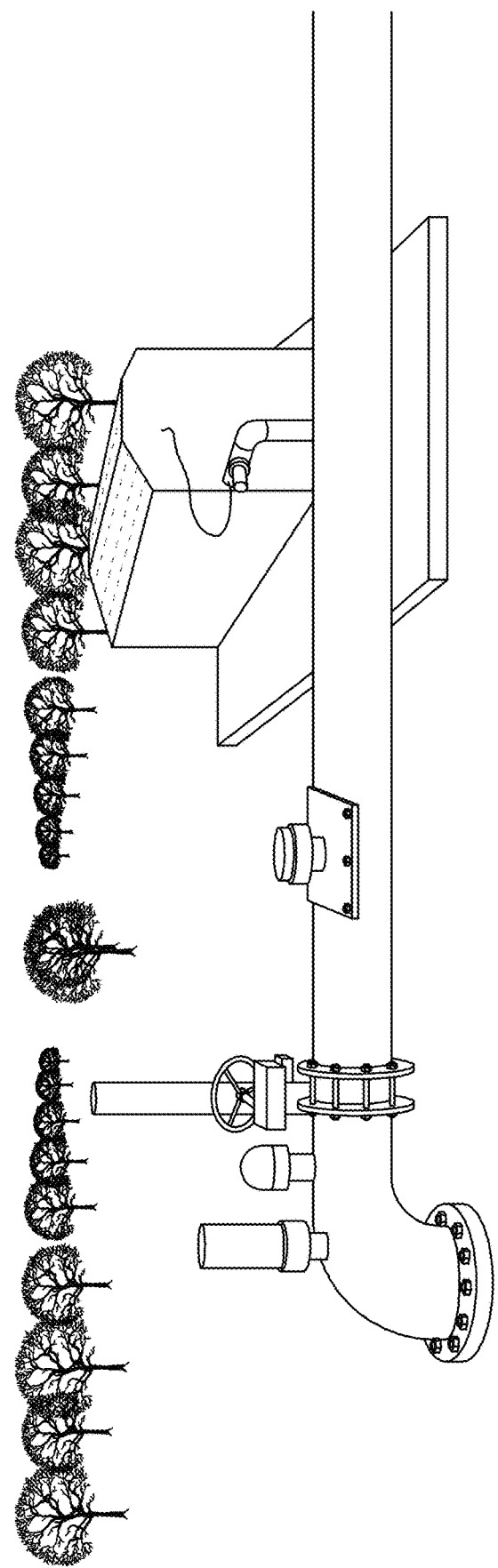
FIG. 18 shows a broken flow meter due to a leak in the piping system.

Furthermore, described herein is a method to measure water using energy data that uses anomaly detection to verify that the measurement is correctly calibrated. It has been known that the relationship between water flow and power in a pumping system varies over time. As a result, power utilities recommend farmers to test the overall pumping plant efficiency (OPE) regularly to save on energy. That factor, however, cannot be used to measure water consumption accurately without monitoring the health of the pumping plant. Therefore, a method to measure water usage in pumping systems from energy consumption data is described in FIG. 16, which has important application to measure ground-water extraction, instead of installing a flow meter as conventionally done which requires a welding job and manual readings. A flow meter is shown in FIG. 17. A flow meter that is not properly installed is shown in FIG. 18.

Furthermore, in another embodiment water lost during a leak is measured from the energy wasted during a leak. We tested the embodiment at the winery where a leak occurred. We compared the results from the method described herein with results from a traditional flow meter. The increased energy consumption due to the leak can be seen in the energy table of FIG. 13-a, which is for a water leak that lasted 41 days. The leak did not change the operating condition of the pump (higher power) but it changed the frequencies of the pumping cycles to compensate for the loss of water in the reservoir tank. Three different methods to calculate the energy wasted to move the water during the leak are described. The first method (method a) is simply compare the energy load of one month with the energy load of a previous month, which leads to an approximation unless the leak match the billing period, and allows to see what the leak cost him in additional electricity. A second method (method b) is to compare the energy consumed during the leak of 41 days with the energy consumed during the same period a year earlier. A third method (method c) is to sum the error signal from the PAM algorithm used to detect the leak, which is proportional to the energy wasted by the leak. The results of energy savings derived are listed in Table 1.

TABLE 1

Energy wasted during the leak that lasted 41 days from Jan. 22 to Mar. 3.

| | | | Estimation of energy wasted (kWh) | | |
|---|---|---|---|---|---|
| Event | Start date | Duration | Method a | Method b | Method c |
| Leak | Jan. 22, 2014 | 41 days | 1,489 | 1,524 | 1,258 |

The potential savings at the winery are significant. The 12-month energy consumption is 12.4 MWh, and the leak represents more than 10% of the annual load. The measurement methods are consistent with each other but method (c) was off by 14% from the median of the three values.

Since there is a direct relationship between the water flowing in a pumping system and the power needed to move it, one can also measure the energy and water lost as a result of a leak. The State of California, for example, requires that pumps are regularly tested for overall pumping plant efficiency (OPE). A properly designed and maintained pumping system has an efficiency higher than 50%. OPE depends on three parameters: the capacity (gallons per minute), the input power (horse power), and the pressure called total dynamic head (feet per head). The equation for OPE is provided in Equation 1.

$$OPE = \frac{Q \times TDH}{3960 \times HPinput}$$

Equation 1. The Overall Pumping plant Efficiency (OPE) can be calculated from water flow Q (gallons-per-minute), the pressure TDH (feet of head) and the input power HPinput (horse-power).

Every pump has a set of possible operating conditions described in a set of curves provided by the pump manufacturer. FIG. 14 describes the set of curves for a well pump (Gould 7GS-20), which was intended to function by pumping between 7 and 9 gallons-per-minute (gpm). Knowing the electrical power of the pump HPinput from the energy data (FIG. 13-a). HPinput is 3.1 kW or 4 hp. The water flow Q from the pump cycles in the energy data (FIG. 13-a) and the water data (Table 1) can be estimated during a fixed period, for instance February 3 to March 3. The result is a flow, Q, of 8.2 gallons-per-minute, which is consistent with the operating range of the pump. From the pumping curve (FIG. 14), the pressure TDH is 630 feet. With all three parameters known, the OPE can be calculated. The result is 32%, which is low, and would allow an alert of the problem to be sent. Knowing the OPE and the TDH of the pumping system also allows one to estimate the water used during a period of time using a variation of Equation 1 that links water and energy rather than water flow and power. It is provided in Equation 2 for water in gallons and energy in kWh.

$$\frac{Water}{Energy} = 177,250 \frac{OPE}{TDH}$$

Equation 2. Relationship between energy (kWh) and water (gallons) in a pumping plant with known OPE (%) and TDH (feet) parameters.

Using the example lead above, the amount of water wasted during the leak from January 21 to March 3 is calculated with the results in table 2. The estimates range from 113,000 to 131,000 gallons of water, which is comparable with the estimate of 100,000 gallons from the water meter between February 3 and March 3. The smart power meter actually provided more accurate water records because it took regular one-hour measurements. The leak lasted longer than the winemaker thought because his crew took less frequent measurements with the water meters.

TABLE 2

Estimation of water wasted during the leak of 41 days based on energy measurements.

| | | | Estimation of water leaked (gallons) | | |
|---|---|---|---|---|---|
| Event | Start at | Duration | Method a | Method b | Method c |
| Leak | Jan. 22, 2014 | 41 days | 131,356 | 137,203 | 113,260 |

Furthermore, in yet another embodiment from energy consumption data, a polynomial decomposition of the water flow according to changes in the power of the pump can be used to estimate more accurately the amount of water used than using an average operating condition. The operating condition can vary due to anomalies, or in the case of VFD pumps due to changes in the load in the irrigation distribution system.

Furthermore, in yet another embodiment of the method to measure water from energy consumption data, a machine learning algorithm calculates the amount of water applied. Regression algorithms such gradient descent can train Support Vector Machines from known data sets that consist of normalized irrigation cycles in an input vector X and of water measurements taken with traditional methods. A vector of weighted coefficients W will be created among thousands of training examples, and it can be applied to measure water from a pump energy data. The disadvantage of this approach is to acquire training data sets. The advantage is cover linear and non-linear situations where the operating condition of the pump changes significantly beyond a small perturbation.

Pumps that are turned on and off manually rather than automatically present a further embodiment that will now be described with respect to FIG. 18. The pumping plant illustrated consists of a well pump (40 hp), a gravity-fed filter, and a booster pump (25 hp). The energy load of the combined pumps is shown in FIG. 18. The irrigator turns the pumping plant on and off manually. As a result, if there is a leak it will not cause an increase in the base load of energy. This situation is different from situations in which pumps are controlled automatically to maintain a minimum pressure. If there is a leak, the pump will not stop and continue to draw energy.

Figure 19:
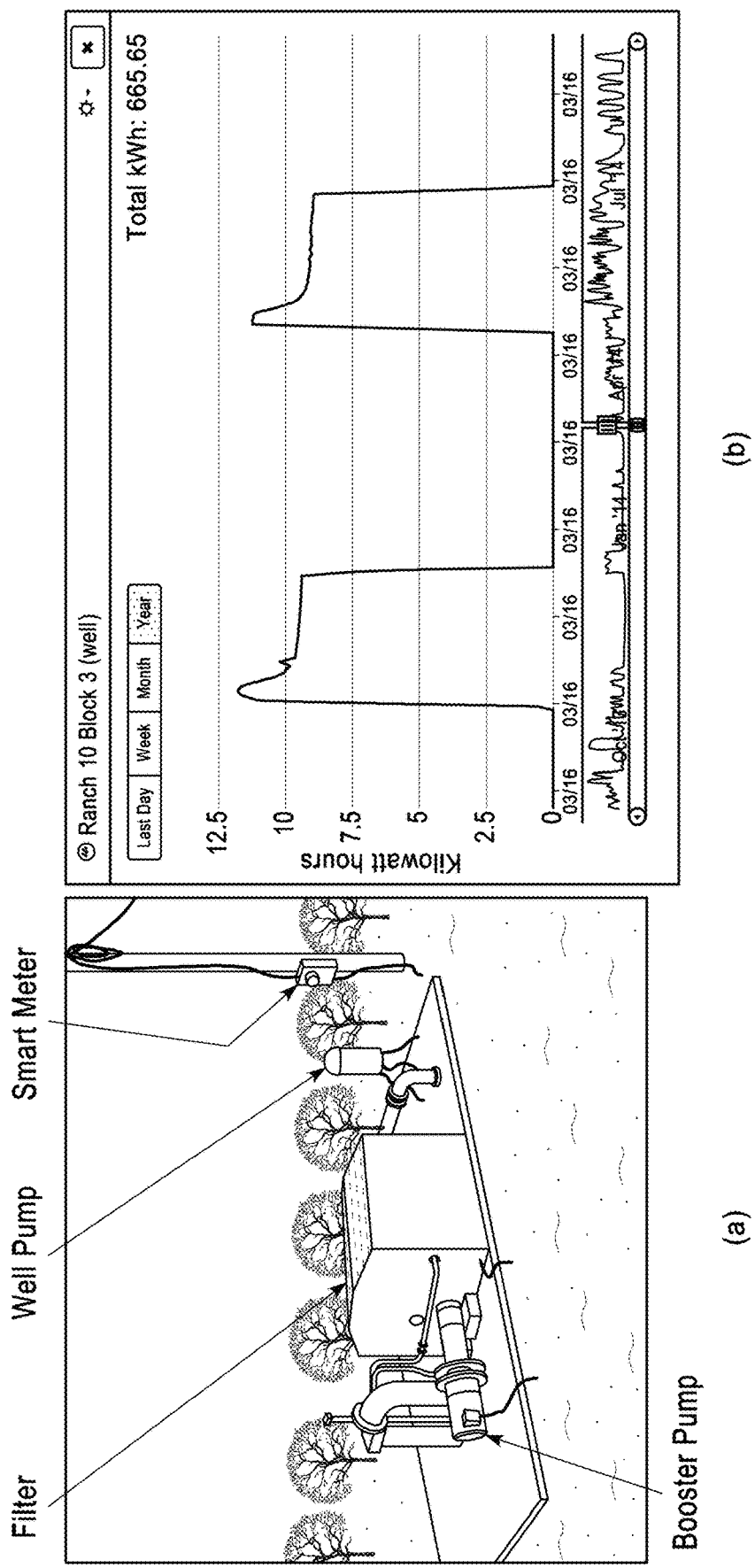
FIG. 19 illustrates energy profiles (b) of a pumping plant with a well pump, a filter and a booster (b).

Further described here is how another anomaly can make it even more difficult to detect water leaks during an irrigation cycle. Energy consumption data though still provide useful information. An example of leak (FIG. 19-*a*) was not detected during an irrigation cycle because it did not cause a change in the energy load. In contrast, the falling water table of the well caused the booster pump to cycle and the energy load decreased overtime (FIG. 19-*b*).

In a further aspect, recognition that other anomalies in water pumping systems exist and can be recognized, in addition or instead of, the anomaly associated specifically with a water leak. Descriptions of that aspect, as well as others, are provided in the examples and discussion that follow.

Figure 20:
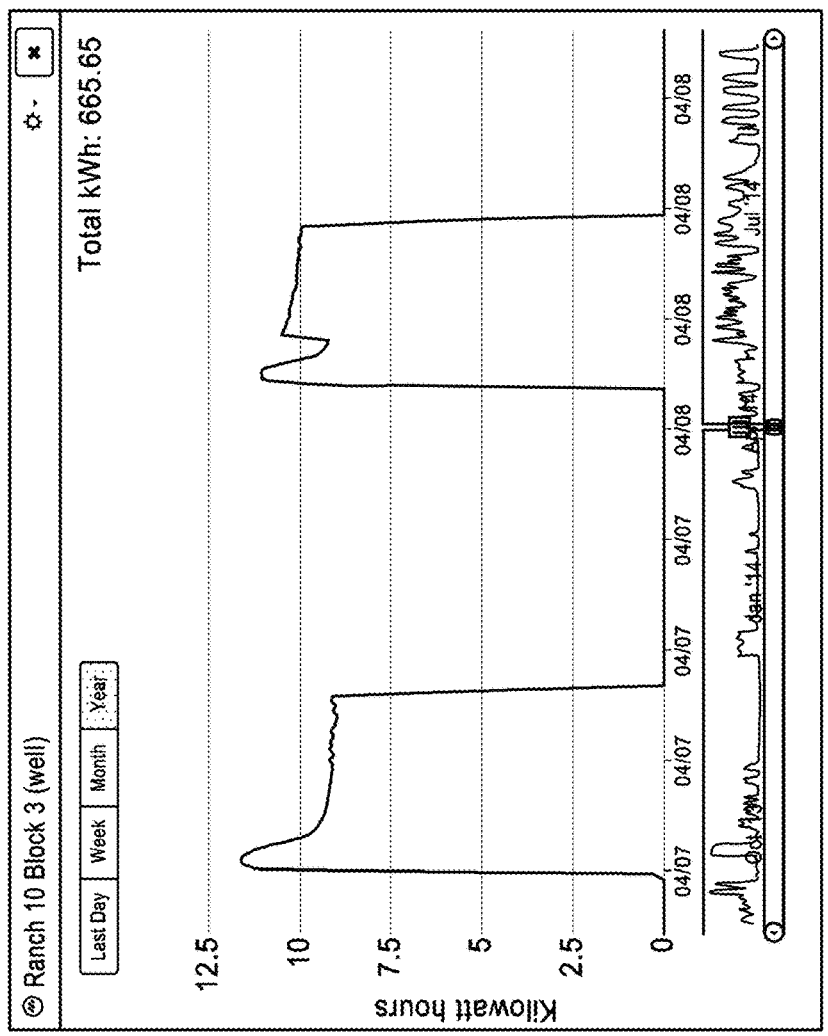
FIG. 20 shows the energy profile of April 8 (b) has one anomaly corresponding to a change in the position of the valve to mitigate lack of pressure due falling water table. In contrast, a leak that occurred earlier that day (a) is not visible.
Figure 20:
Figure 21:
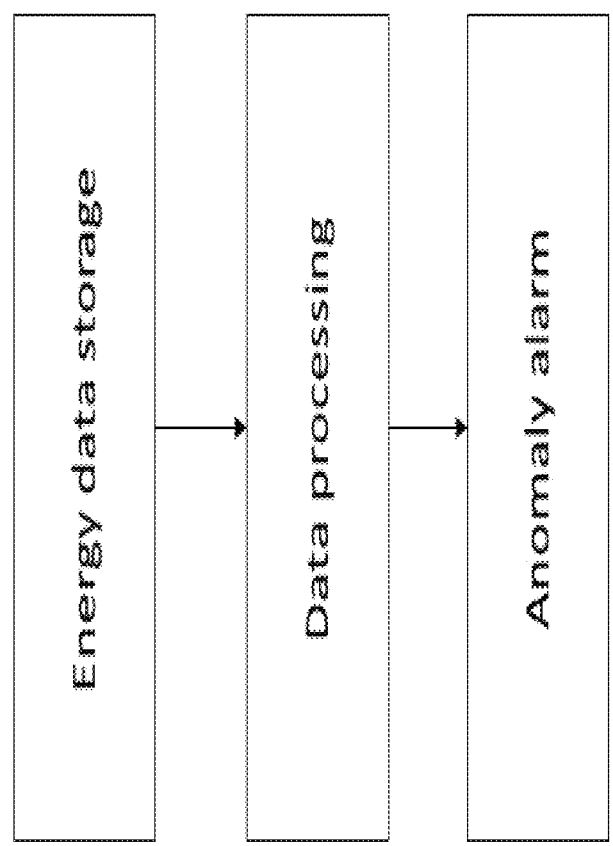
FIG. 21 illustrates a method to detect an anomaly in a pumping plant for irrigation
Figure 22:
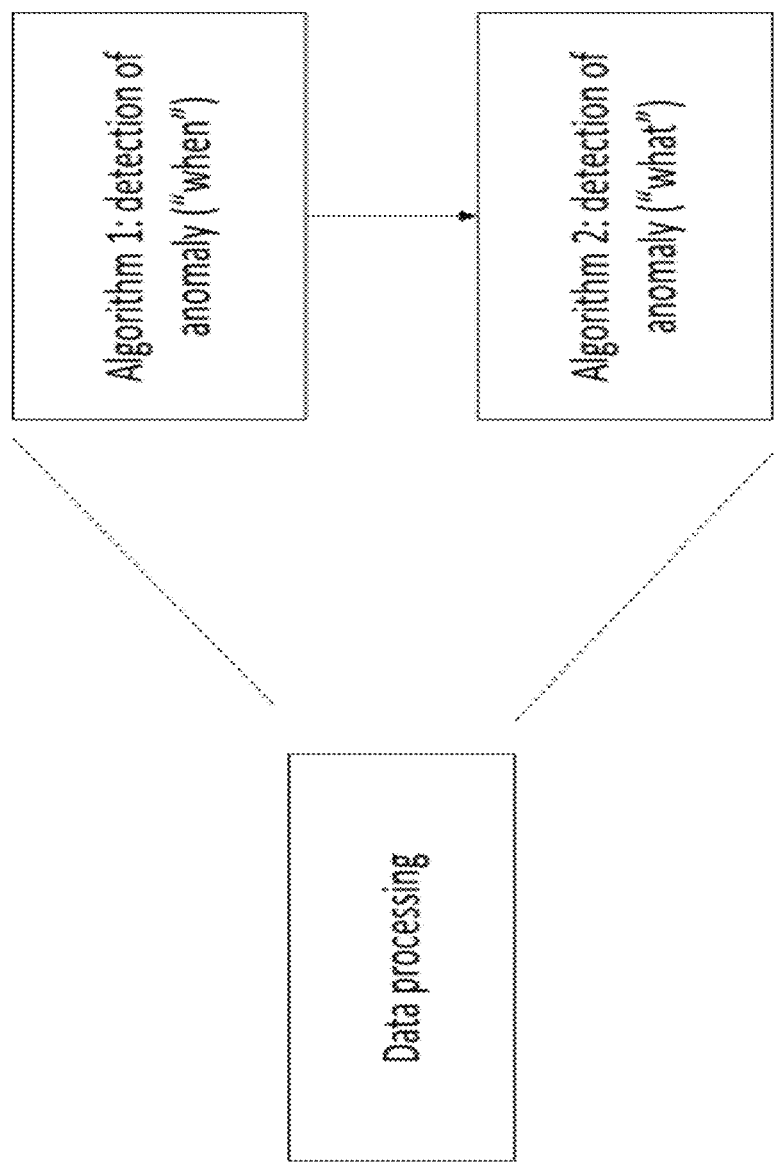
FIG. 22 shows implementation of the data processing step into two steps: one to detect when an anomaly occurs (algorithm 1) and one step to identify what the anomaly is (algorithm 2).
Figure 29:
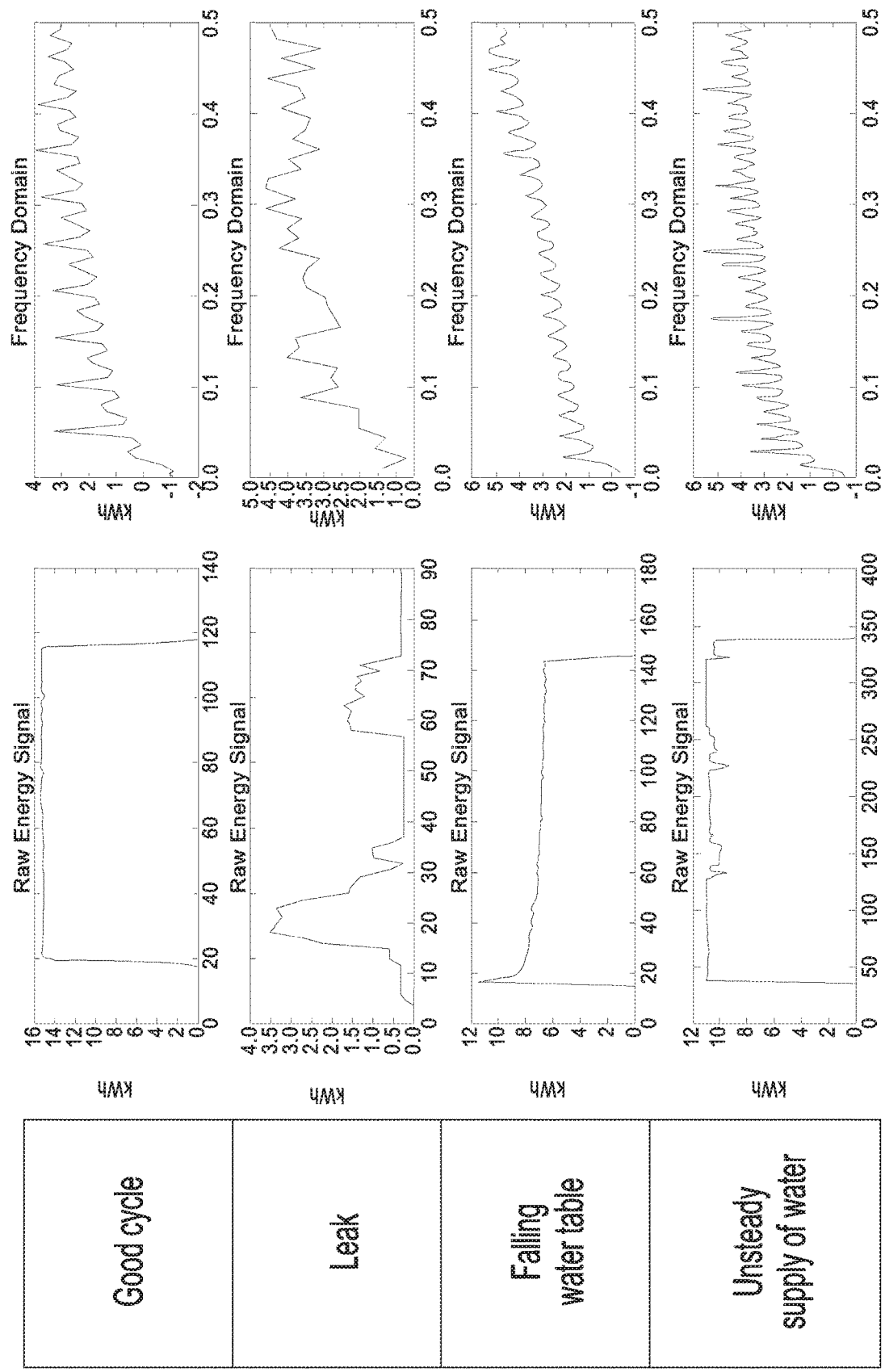
FIG. 29 shows examples of signatures in time-domain (left column) and frequency domain (right column).
Figure 29:
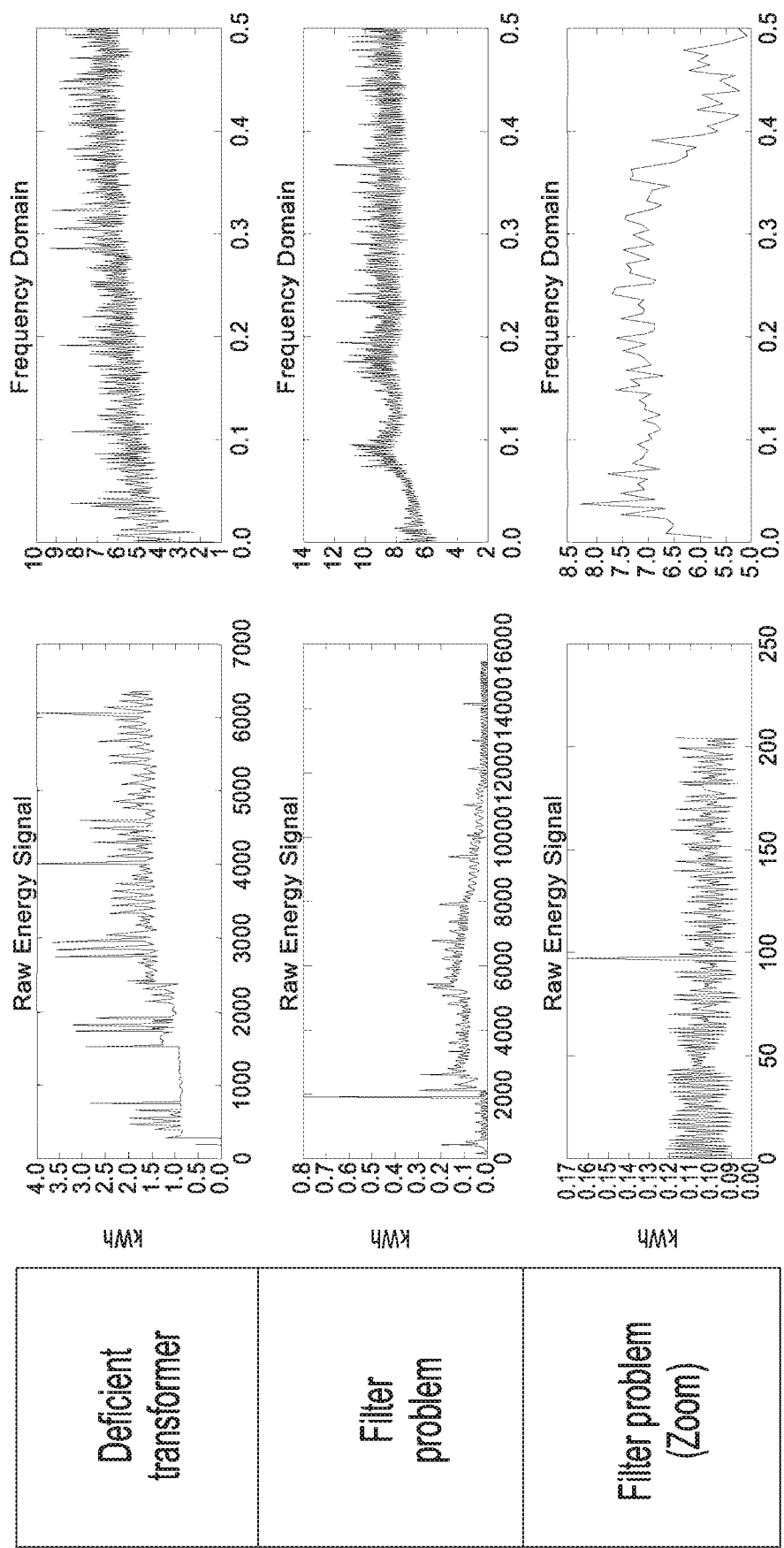

As such, in a specific aspect described herein is a method to include anomalies other than water leak alerts and send an alert with a text message that identifies the other anomaly (FIG. 20). As is described, a first program (also referred to as first algorithm) which runs software on the computer system is used to detect that there is an anomalous behavior (FIG. 21). A second program (also referred to as second algorithm) which runs software on the computer system is used to classify the previously detected anomaly among known categories (FIG. 22). The list of categories can include leak, falling water table, electrical failure, and others. Described is thus a matrix of "electrical signatures" in time-domain and frequency-domain for those common anomalies (FIG. 29). They can form a set of classification algorithms written in software and executed by the computer system.

Furthermore, classification algorithms include supervised learning techniques such as Support Vector Machines or Neural Networks, and unsupervised learning techniques such as Partinionin Around Medoid and K-Mean.

Furthermore, we recognize that in order to detect an anomaly in a pumping plant using energy data, its energy signature must be greater than the noise. The variation of the energy consumption can be estimated in several ways; one way is listed in Equation 3.

$$\Delta E = \frac{E\max - E\min}{E\mathrm{mean}}$$

Equation 3. Estimation of noise in a pump by diving the maximum variation divided by the average in an on-state. For relatively good pumps, it is usually lower than 5% of the cycle's mean of energy consumption. Filtering can help for known sources of variation (e.g., other appliance connected to the same meter). Although it is hard to estimate how the pressure will change due a specific anomaly, using pump curves that are then stored in electronic form and accessed by the software that is created based on the principles described herein, one can determine the minimum change required to create a variation that is greater than the noise $\Delta E$. A linear regression is useful. For example, given the pump curve in FIG. 23, the operating point is highlighted in green: Water Flow=580 gpm and TDH=112 feet of head. A change of 5% of the energy consumption would require, according to the pump curve, the operating point to move on the curve to a new point such as the one highlighted in red. The change represents a modification of 54 gpm in water flow. The example is a first order approximation. An anomaly such as a leak that affects the pressure (TDH) will also affect both the water flow and the pump efficiency (OPE). Thus, the relationship between energy consumption and pressure depends on the pump curve, and so varies over every pump model.

Figure 23:
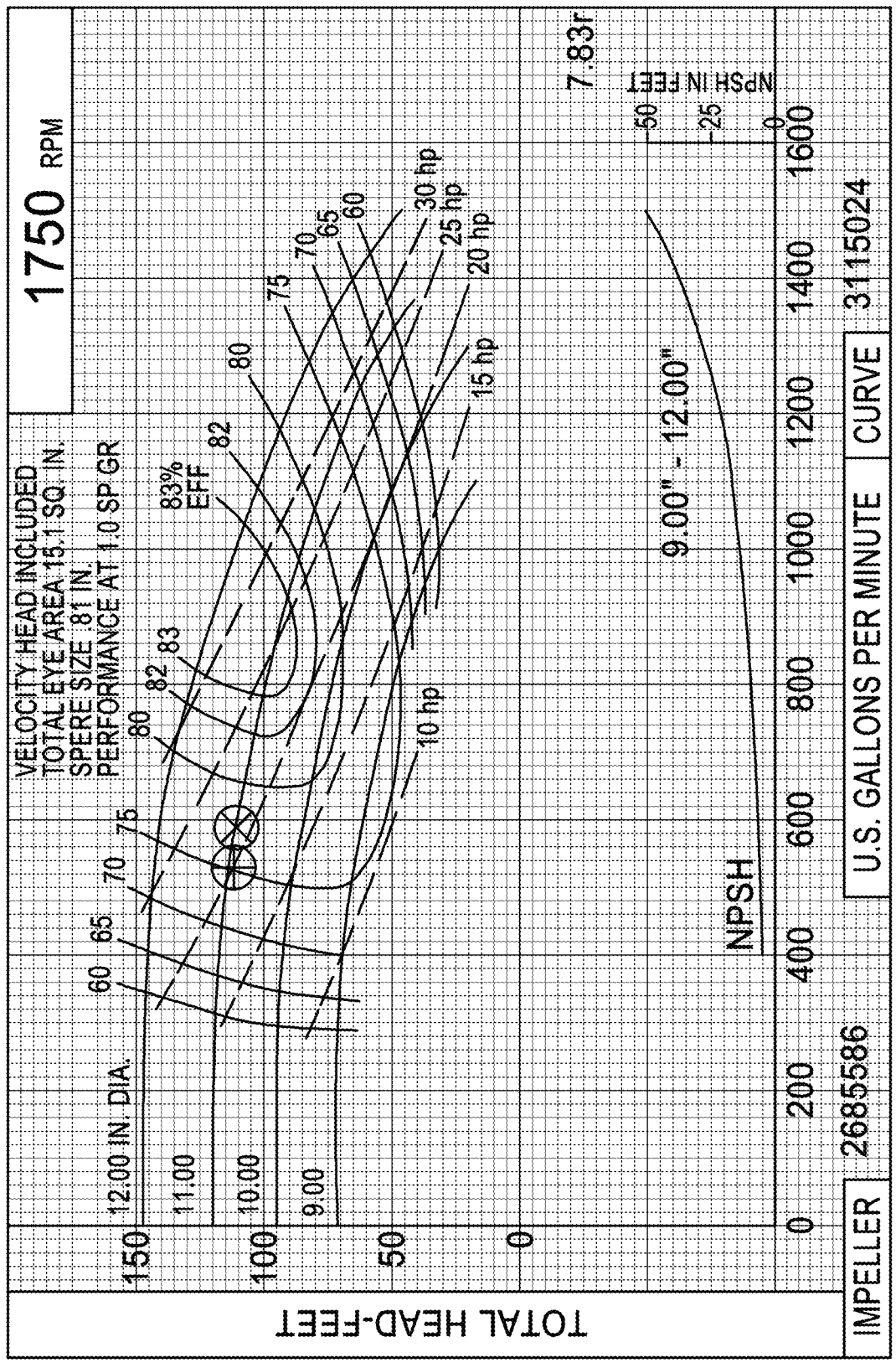
FIG. 23 shows a pump curve with two operating conditions before perturbation (green) and after perturbation (red).
Figure 24:
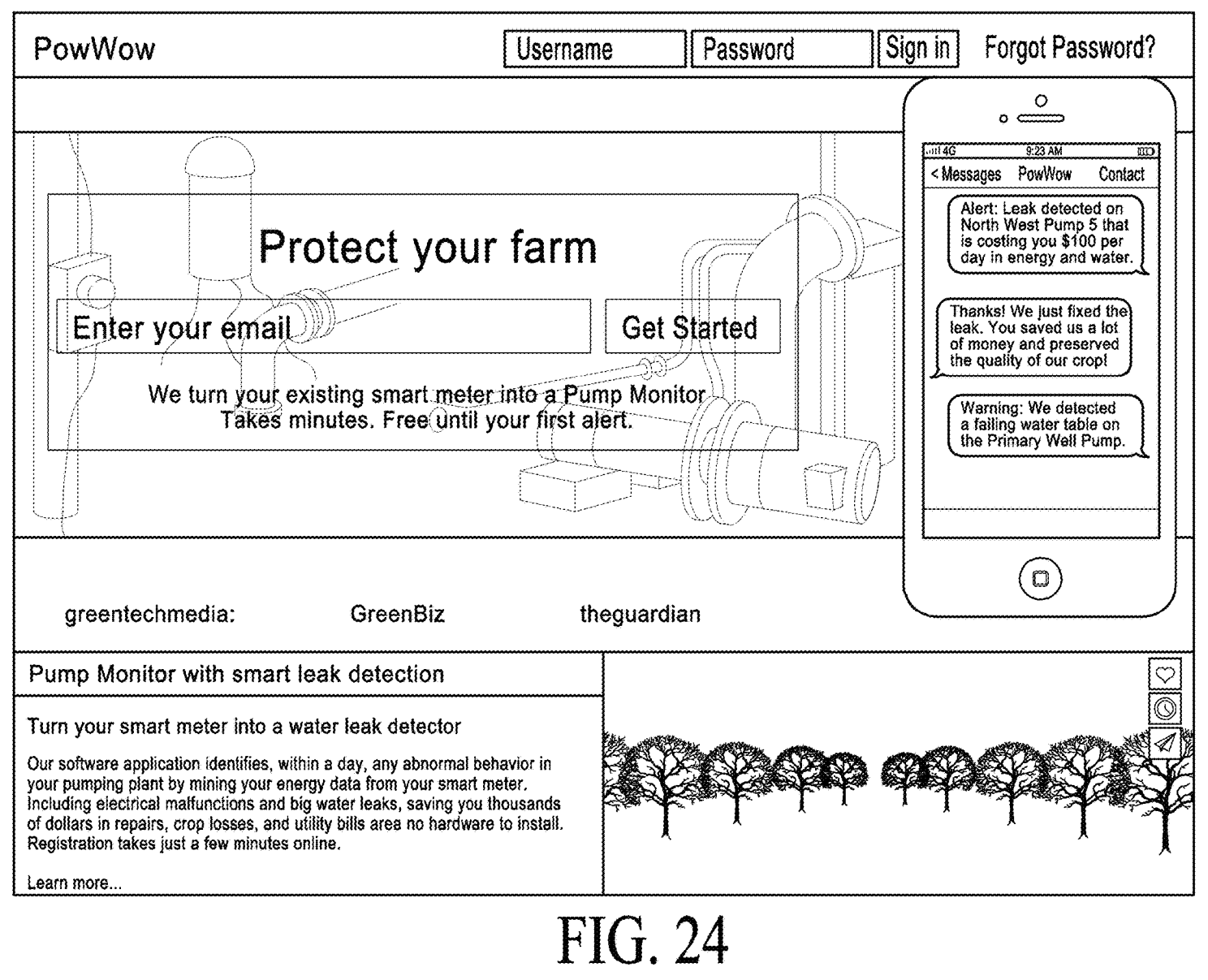

In one embodiment of the general methods described above to detect anomalies and measure, the following Pump Monitor program was implemented. It provides intelligent answers for growers based on their smart meter electricity usage (FIG. 23). The general process of the program is described in FIG. 24.

A. Account Setup

The account setup collects enough data for each pump to be monitored.

The data required for electrical anomaly (including leak) detection is this:

1. Pump location (geo-coordinates)
2. Electrical meter information including utility login
3. Matching of pumps to the meter
4. Pump type (irrigation, VFD/Pressurized system)
5. Other equipment at this meter (e.g. barn, winery, house)

Additional data is required to estimate water usage. Most of these will come from a pump test, or can be found by inspection of the equipment.

1. Gallons per minute rating (or equivalent flow rating)
2. Water source (well or canal/stream)
3. Total Dynamic Head of the pump system
4. Operational pump efficiency
5. Rated pump horsepower(s)

Additional data is desirable to increase accuracy of water usage. This includes information describing the pump and well. Examples of this information are:
1. Pump model(s) & type & size
2. Impeller size(s)
3. The pump data curves from manufacturer for all pumps within the system.

B. Benchmark of Historical Data

The benchmark process reads the previous 13 months of electrical history and results in three outputs. The first two are intended for use by the account representative and customer to ensure the pump is functioning properly so that electrical monitoring and water estimation can be performed.

1) A report showing historical summary of usage
   a. Average irrigation hours per day/week across the season
   b. Power usage by month
   c. Estimated water usage (if GPM and other parameters are available)
2) Analysis of pump operation
   a. Any anomalies noticed
   b. Comparison of stated electrical horsepower and actual horsepower. This determines if the pump is operating near the design specification
3) Internal calibration of the algorithm for this specific pump C. Periodic Analysis The daily or hourly analysis looks at the electrical usage from the new and previous internals and looks for problems and also estimates water used. There are several different algorithms used, depending on the pump type (large well pump, VFD, pressurized, canal pump). Each of these algorithms has two parts: detect a problem, then classify what kind of problem was found. The calibration done during the benchmark determines the "normal" parameters. There are two primary results:

Text alerts in the event anomalies are found. Alerts may be of a general anomaly, or they may have more specific information based on the classification of known anomaly types.

A daily report available on the website about energy usage and estimated water

Texts that are received in reply are logged and used to track response to the alert.

D. Monthly Report

The monthly report is sent by email to customers that have requested it. This report summarizes the electricity and water used in the previous month, along with any reported problems and how quickly they were fixed.

E. Yearly Report and Recalibration

The purposes of the yearly report:

Provide report for account managers to help customers plan for the next season

Adjust calibration parameters based on the full season of data to improve accuracy for the subsequent season All of the steps in the benchmarking are performed, with focus on the season (January 1-December 31) or other growing season as determined by the crop.

There are additional elements:

Comparison of year to year seasonal effects, incorporating reference evapotranspiration parameters and other weather data (e.g. California Irrigation Management Information System)

Figure 25:
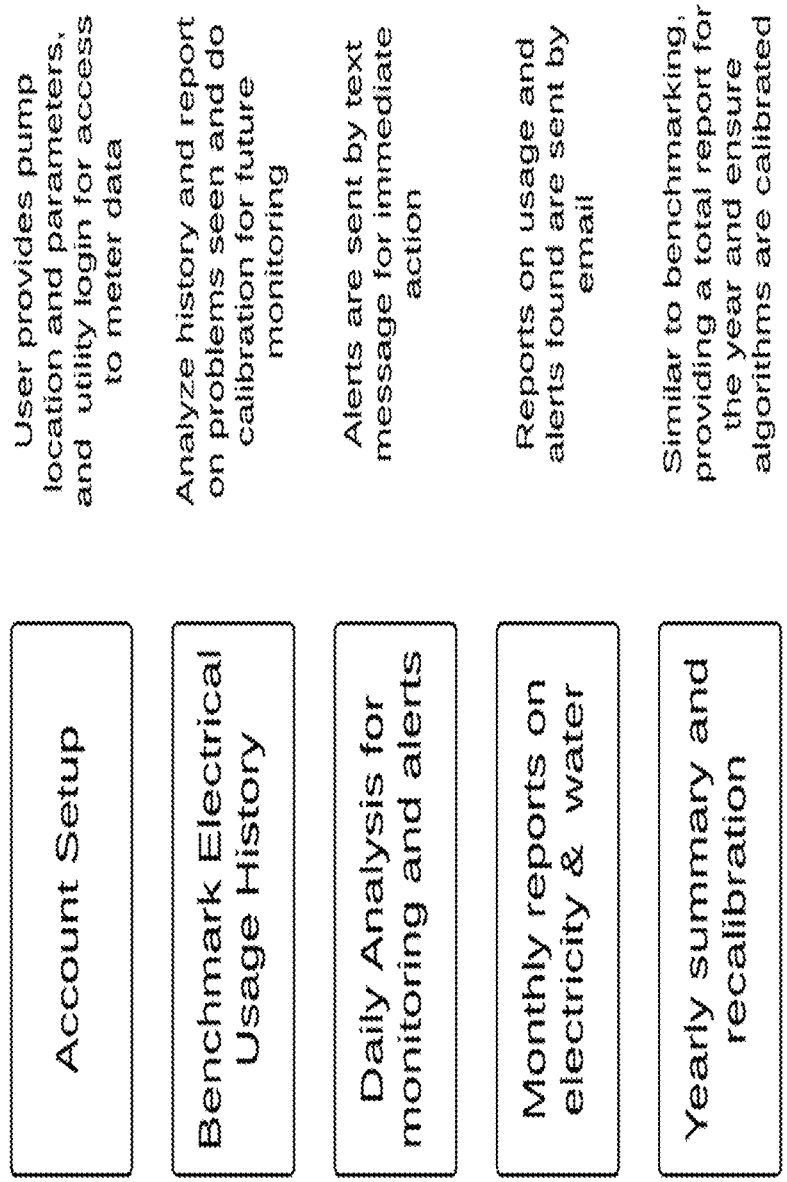
FIG. 25 describes the 5 main steps in the Pump Monitor program.

The calibration of algorithms may include multiple seasons of data to allow better season-specific algorithms The Pump Monitor program is self-calibrating based on the historical data. We now explain in more details the periodic analysis that consists of the anomaly detection, the anomaly classification, and the water calculations. For illustration, we only show mean and standard deviation of the energy load (FIG. 25). More features can be used to improve accuracy of the algorithm. The algorithm has 5 steps:

1. Cycle extraction. This takes the energy data for the current time period and appropriate previous days to determine the start and stop time of each irrigation cycle. Two different approaches are used to ensure accuracy. The first approach uses a power threshold comparison based on the data from calibration, along with cycle length. It works extremely well on "square wave like" power signals. The second approach uses a power density clustering approach to determine when cycles begin and end. This approach works better for pumps where the meter has additional loads or permanent baseline changes have occurred.

2. Feature extraction. Given the cycle start & stop, the next step is to extract features from the consumption points contained in the cycle for comparison. There are several features that can be used. For illustration, Drawing 1 above shows how the mean $\mu$ and standard deviation $\sigma$ are used.

3. Anomaly detection. The mean for this cycle is compared to the nominal mean as determined by benchmarking, as well as a threshold selected during calibration. The standard deviation of the cycle is also compared to thresholds. If either value is out of the expected range, an anomaly has been detected.

4. Anomaly classification. The pump monitor uses a set of classification algorithms. Some of them depend on the cycle extract and scoring described above, others combine anomaly detection and classification in a single processing pass for efficiency. Once an anomaly has been found, the data in that cycle is further examined to compare to a set of known features for classification. Examples include water draw-down due to falling water table, and suspicious electrical activity. These pattern recognition approaches are based on standard methodologies.

5. Leak detection. For automatically controlled well pumps (such as a pressurized system shared with a house or other facility), there is a unique power signature that represents a leak. We can use the existing classifier based on PAM.

6. Water calculation. The pump monitor computes water usage based on energy used and knowledge of the pump. A way to calculate water usage to look at the "on" time of the pump and look at the rated flow in GPM either from a recent pump test, or from original design parameters. This does not reflect the reality, since often pumps are operated outside of design parameters, and the last pump test may have been done years ago. As such, described herein is a better way to compute water usage based on the power used. The actual water flow and power used are based on several factors, including Total Dynamic Head (TDH), the Operational Pump Efficiency (OPE). The equation is $$\text{Power(KW)} = 0.746 * \frac{GPM * TDH}{3960 * OPE}$$

Figure 26:
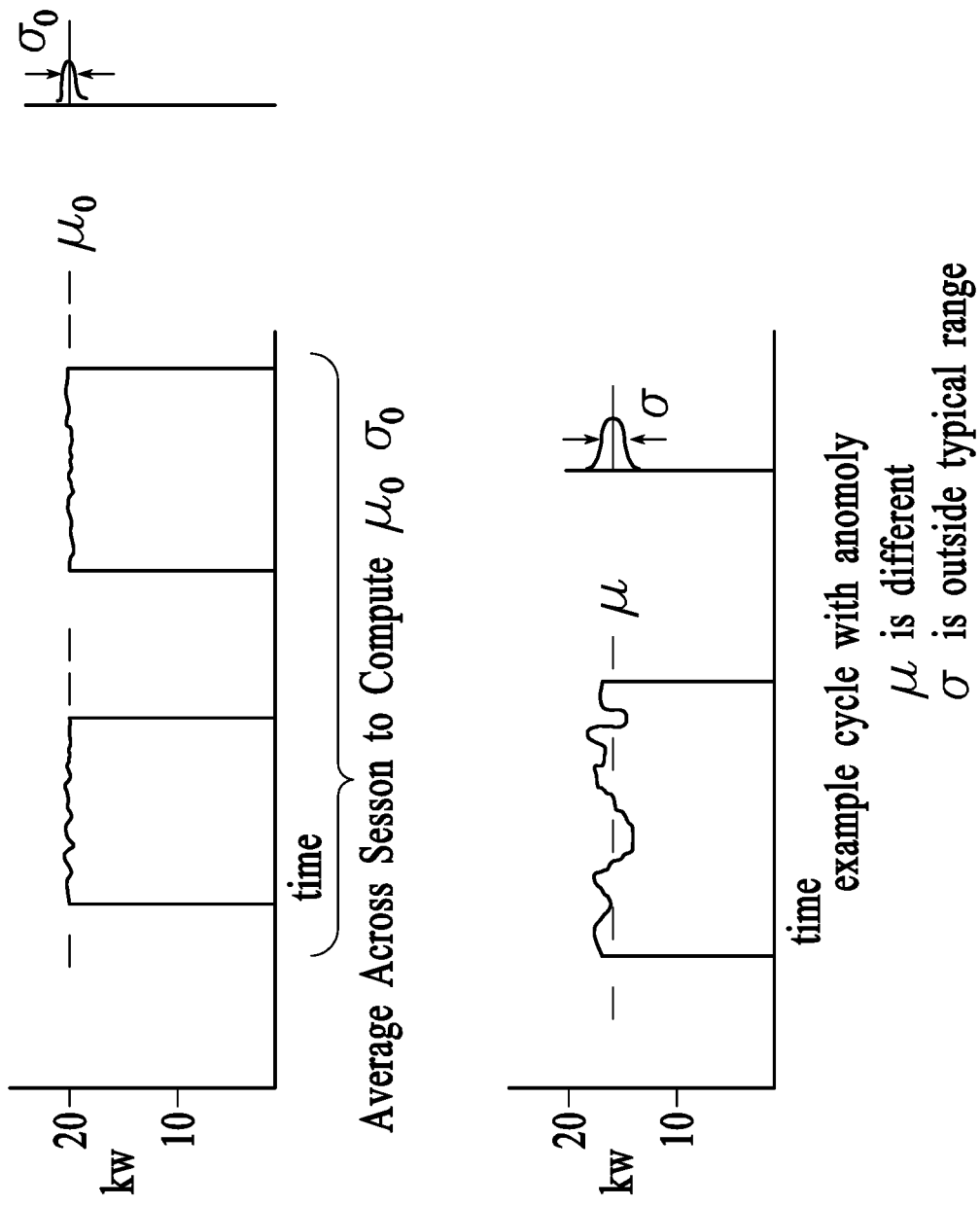
FIG. 26 illustrates the anomaly detection using statistical data analysis using mean and standard deviation as features.

The equation is misleading though: the GPM, TDH and OPE are not independent once the pump is installed. A specific pump has a curve (provided by the pump manufacturer) that relates the 4 variables above. An example is provided in FIG. 26.

Diagram 2—pump curve relates power, GPM, TDH and OPE

The results of the last pump test (or design parameters) establish a nominal operating condition relating power used and GPM:

$$GPM_{nom}=K_1*P_0$$

To compute a water usage from power, we use the equation above as well as the pump curve to create a calibration that allow estimation of water flow based on the deviation from nominal power input.

$$GPM_{actual}=K_1*P_0+K_2*\Delta P+K_3*\Delta P^2$$

In the above, the constants K come from fitting a polynomial to the pump curves, based on the last pump test that determines the location on the curve of the nominal location. The variable $\Delta P$ is computed for each interval based on the power usage deviation from the nominal conditions of the last pump test.

Figure 27:
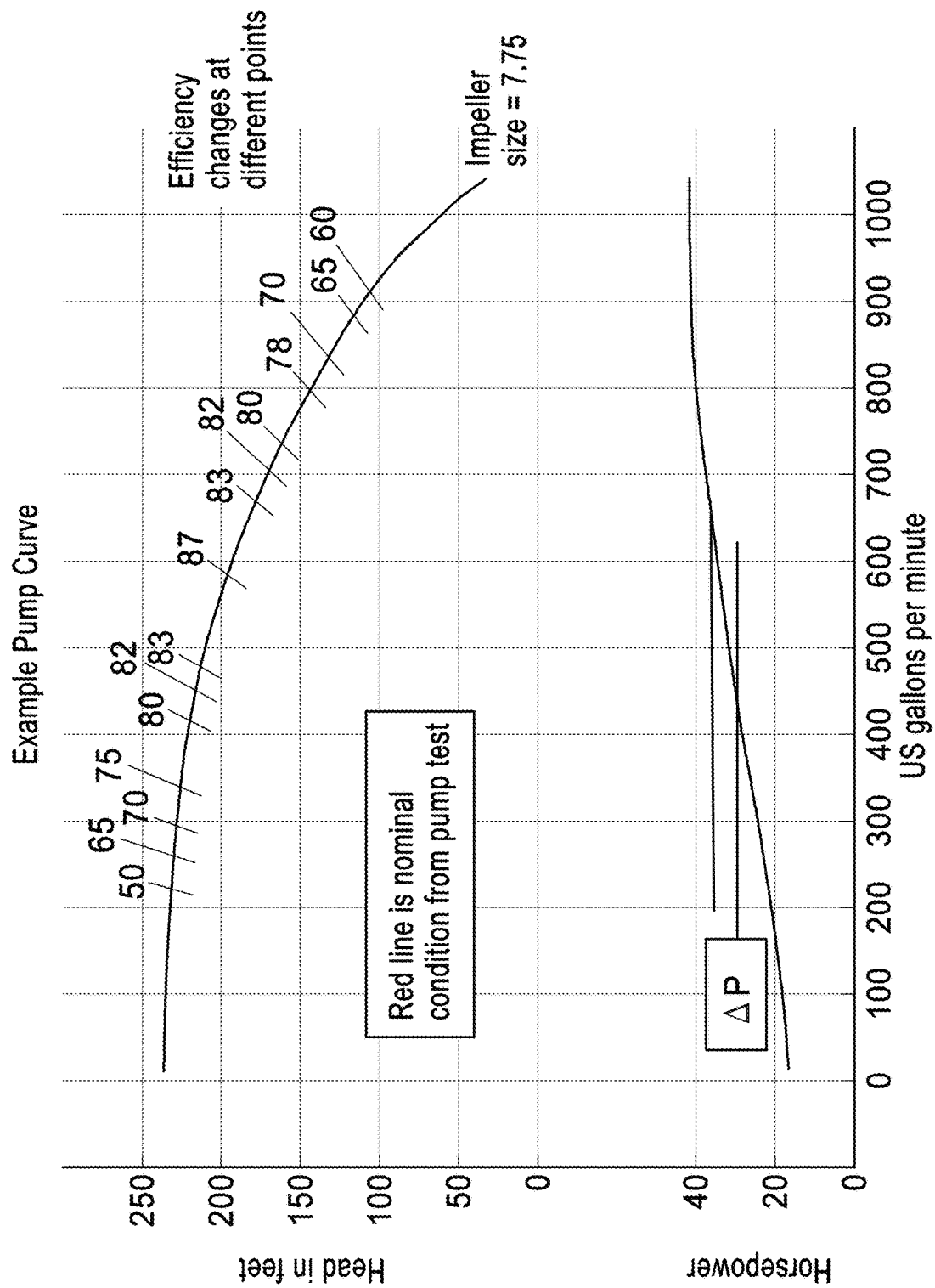
FIG. 27 shows water flow estimation from power measurement. If the pump does not work at its normal operating condition (P0), the water flown is calculated from a polynomial decomposition for a small perturbation DeltaP.
Figure 28:
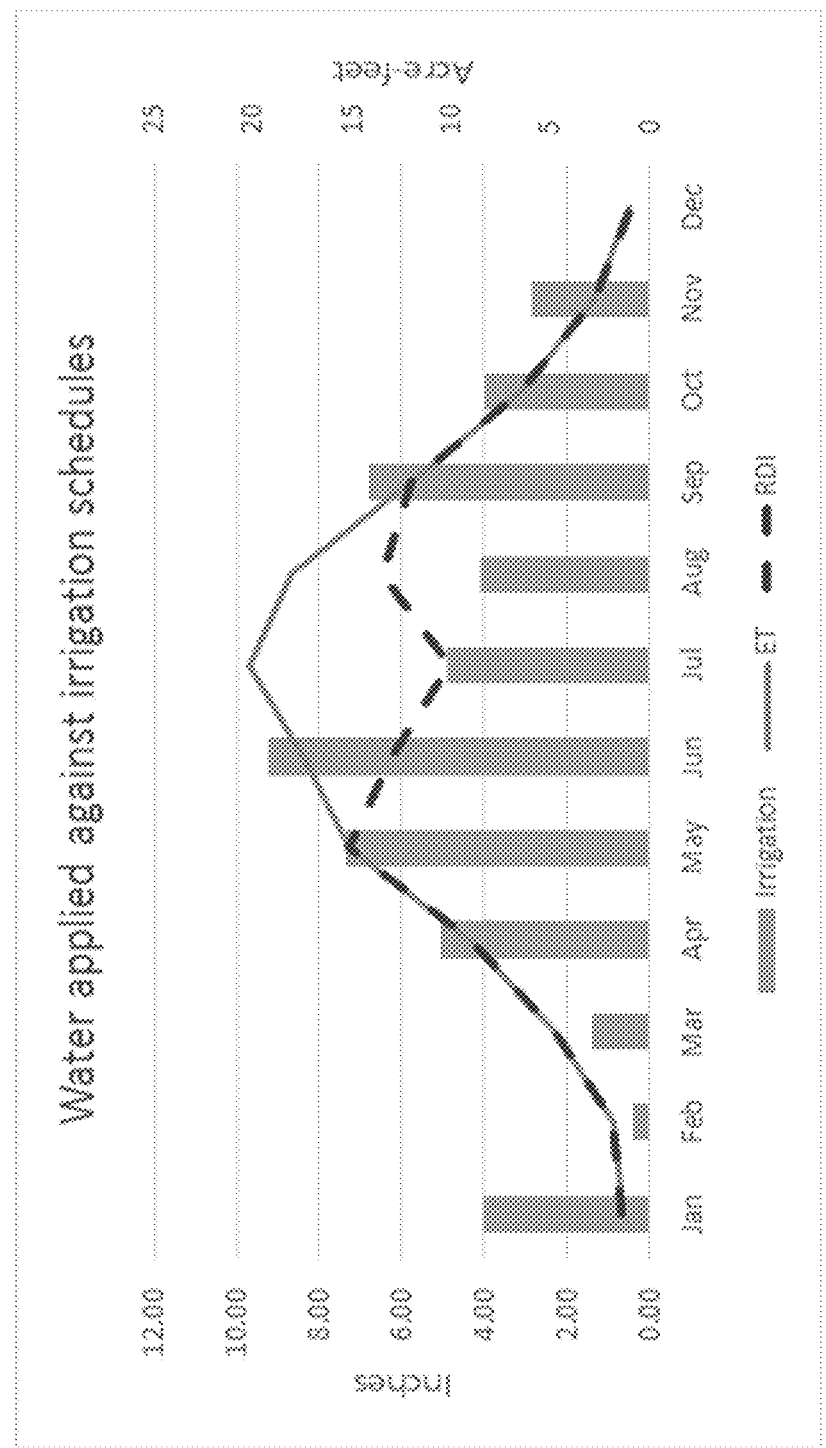
FIG. 28 shows water measurements from energy data across one complete season against Evaporation-Transpiration (ET) values to grow a crop. The crop is almond. Reduced Deficit Irrigation from ET values are also plotted. Growers can save water by comparing the quantity of applied water against RDI targets without risking losing the crop.

In another embodiment, we implemented the water measurement method to compare with the expected amount of water that should be applied to grow the crop. If too much water is applied, an alert can be sent to the grower who can turn the pump off. If not enough water is applied, and the plant is stressed as a result, an alert can also be sent to so the grower turns the pump off. Plants use water through transpiration, and irrigated water is also lost due to evaporation. A popular industry practice is to schedule based on the evaporation and transpiration rates of the crop, also known as evapotranspiration (ET). ET values are available as a public service in many states. For instance, CIMIS provides daily ET values in California. Growers can register online. In one example the volume of water from the CIMIS model for the orchard was compared with the actual amount of water applied to the field. The water applied to the field was calculated from energy data. The pump used for irrigation of the field did not have a flow meter. FIG. 27 summarizes the ET values over one season at that location (line). The amount of water actually applied shown as well (columns). It is apparent that the field is irrigated much less than the ET model requires during summer. This is because almond is more water resistant during the months of July and August when there is hull split and the crop is getting ready to harvest. The approach to reduce irrigation at non-critical times is referred to as a Reduced Deficit Irrigation (RDI) model. Research universities such as UC Davis and CSU Fresno have studied this in details for a number of crops including almond to save water.

In yet another embodiment, RDI schedules can be compared to the water applied so the grower can save water and energy without taking the risk of losing crop. A daily text service is particularly appropriate as extended periods of stress can have a dramatic impact on the crop at particular times of the year. FIG. 27 also summarizes RDI values (dotted line) for the previous example at an orchard. In general the irrigation of the field follows the RDI model except for two events:

In January, the grower irrigated the field much more, which was expected the field was not irrigated during winter. The soil has a certain water holding capacity and acts as a sponge or small reservoir. The soil needed to be replenished. In January, the field was irrigated to maintain an appropriate level of moisture in the soil. The grower would have received a text alert in December unless this particular seasonal effect was taken into account in the program.

In August, the field was irrigated much less, which was due to repairs to the drip irrigation lines that month which led to no irrigating as a result. As a result the grower would have received an alert to turn the pump on.

Although the present invention has been particularly described with reference to the preferred embodiments thereof, it should be readily apparent to those of ordinary skill in the art that changes and modifications in the form and details may be made without departing from the spirit and scope of the invention.

What is claimed is:

1. A method of providing an automated water record for an irrigation system using ground water extraction and that includes an electrical water pump that operates using electrical energy and which is connected to an energy meter that periodically provides for a previous period of time energy usage data for the previous period of time, the method comprising the steps of:

receiving and storing the energy usage data associated with the irrigation system for the previous period of time in a database;

using the energy usage data for the previous period of time to estimate water usage for the previous period of time using a data processing computer system coupled to the database that operates upon the energy usage data, wherein the data processing system that operates upon the energy usage data uses an average operating condition during a time period in obtaining the water usage estimate during the same time period; and preparing the water record based upon the estimated water usage using the data processing computer system.

2. A method of providing an automated water record for an irrigation system using ground water extraction and that includes an electrical water pump that operates using electrical energy and which is connected to an energy meter that periodically provides for a previous period of time energy usage data for the previous period of time, the method comprising the steps of:

receiving and storing the energy usage data associated with the irrigation system for the previous period of time in a database;

using the energy usage data for the previous period of time to estimate water usage for the previous period of time using a data processing computer system coupled to the database that operates upon the energy usage data, wherein the data processing system that operates upon the energy usage data uses a polynomial decomposition of water flow according to changes in power of the water pump in obtaining the water usage estimate of a pump working away from its average operating condition; and preparing the water record based upon the estimated water usage using the data processing computer system.

3. A method of providing an automated water record for an irrigation system using ground water extraction and that includes an electrical water pump that operates using electrical energy and which is connected to an energy meter that periodically provides for a previous period of time energy usage data for the previous period of time, the method comprising the steps of:

receiving and storing the energy usage data associated with the irrigation system for the previous period of time in a database;

using the energy usage data for the previous period of time to estimate water usage for the previous period of time using a data processing computer system coupled to the database that operates upon the energy usage data, wherein the data processing system that operates upon the energy usage data uses machine learning in obtaining the water usage estimate based on a type of pump curve that relates water flow, horse power, and feet of head; and preparing the water record based upon the estimated water usage using the data processing computer system.

4. The method according to claim 1, wherein the previous period of time is at least a 24 hour period.

5. The method according to claim 1, wherein the previous period of time is at least a one hour period.

6. The method according to claim 1, wherein the previous period of time is a one minute period.

7. The method according to claim 2, wherein the previous period of time is at least a 24 hour period.

8. The method according to claim 2, wherein the previous period of time is at least a one hour period.

9. The method according to claim 2, wherein the previous period of time is a one minute period.

10. The method according to claim 3, wherein the previous period of time is at least a 24 hour period.

11. The method according to claim 3, wherein the previous period of time is at least a one hour period.

12. The method according to claim 3, wherein the previous period of time is a one minute period.

* * * * *